(12) United States Patent
Hatakeyama

(10) Patent No.: US 8,503,072 B2
(45) Date of Patent: Aug. 6, 2013

(54) GAIN-CLAMPED SEMICONDUCTOR OPTICAL AMPLIFIER

(75) Inventor: Hiroshi Hatakeyama, Minato-ku (JP)

(73) Assignee: NEC Corporation, Tokyo (JP)

( * ) Notice: Subject to any disclaimer, the term of this patent is extended or adjusted under 35 U.S.C. 154(b) by 2096 days.

(21) Appl. No.: 10/548,880

(22) PCT Filed: Dec. 26, 2003

(86) PCT No.: PCT/JP03/16950
§ 371 (c)(1),
(2), (4) Date: Sep. 14, 2005

(65) Prior Publication Data
US 2011/0149381 A1   Jun. 23, 2011

(30) Foreign Application Priority Data
Mar. 14, 2003   (JP) .................................. 2003-070075

(51) Int. Cl.
*H01S 4/00* (2006.01)

(52) U.S. Cl.
USPC .......................................... 359/344; 359/349

(58) Field of Classification Search
USPC .................................. 359/344, 349
See application file for complete search history.

(56) References Cited

U.S. PATENT DOCUMENTS

| | | | | |
|---|---|---|---|---|
| 5,048,909 A * | 9/1991 | Henry et al. | ..................... | 385/27 |
| 6,148,132 A * | 11/2000 | Hamamoto | .................... | 385/131 |
| 6,347,104 B1 * | 2/2002 | Dijaili et al. | ............... | 372/38.01 |
| 6,400,500 B1 * | 6/2002 | Tidmarsh et al. | ............. | 359/344 |
| 6,462,865 B1 * | 10/2002 | Chu et al. | ...................... | 359/344 |
| 6,687,267 B2 * | 2/2004 | Bukkems | ........................ | 372/20 |
| 6,856,452 B2 * | 2/2005 | Kim et al. | ...................... | 359/332 |
| 2001/0009594 A1 * | 7/2001 | Hosoi | ................................ | 385/2 |
| 2003/0067678 A1 * | 4/2003 | Shibata et al. | ................ | 359/344 |
| 2003/0123784 A1 * | 7/2003 | Mukai | ............................. | 385/15 |
| 2003/0151796 A1 * | 8/2003 | Kim et al. | ...................... | 359/326 |
| 2003/0152324 A1 * | 8/2003 | Betty et al. | ..................... | 385/29 |

FOREIGN PATENT DOCUMENTS

| | | | |
|---|---|---|---|
| EP | 0422854 | A2 | 10/1990 |
| EP | 0762576 | A1 | 3/1997 |
| EP | 0898348 | A1 | 2/1999 |
| EP | 1052747 | A2 | 11/2000 |
| JP | 3-198032 | A | 8/1991 |
| JP | 04-043330 | A | 2/1992 |
| JP | 5-507175 | A | 10/1993 |
| JP | 9-121072 | A | 5/1997 |
| JP | 11-068240 | A | 3/1999 |
| JP | 2000-012978 | A | 1/2000 |
| JP | 2000-077771 | A | 3/2000 |
| JP | 2000-77771 | A | 3/2000 |

(Continued)

OTHER PUBLICATIONS

Hamamoto et al. "Single transverse mode active multimode interferometer InGaAsP/InP laser diode", Electronics Letters, vol. 34, No. 5, (Mar. 1998).*

(Continued)

*Primary Examiner* — Eric Bolda
(74) *Attorney, Agent, or Firm* — Sughrue Mion, PLLC

(57) ABSTRACT

A gain-clamped semiconductor optical amplifier according to the present invention has a pair of DBR areas 2, 3 disposed in sandwiching relation to gain area 1 for amplifying guided light. A portion of a waveguide of gain area 1 comprises MMI waveguide 11.

14 Claims, 13 Drawing Sheets

(56) References Cited

FOREIGN PATENT DOCUMENTS

| | | |
|---|---|---|
| JP | 2000-174383 A | 6/2000 |
| JP | 2000-323781 A | 11/2000 |
| JP | 2000-323782 A | 11/2000 |
| WO | WO 91/17575 A | 11/1991 |
| WO | WO 96/13084 A | 5/1996 |
| WO | WO 96/13084 A1 | 5/1996 |
| WO | WO 9613084 A1 * | 5/1996 |

OTHER PUBLICATIONS

European conference of optical communications' 2000 (ECOC'2000) International Meeting, paper 1.3.2.
IEEE Electronics Letters, vol. 35, No. 6, pp. 485-487, 1999.
IEEE Electronics Letters, vol. 36, No. 14, pp. 1218-1220, 2000.
IEEE Electronics Letters, vol. 32, No. 22, pp. 2076-2077, 1996.
Technical digest of Optical Fiber communications 2001 (OFC2001), post deadline paper PD13.

* cited by examiner

| Number of aray | N lines |
| --- | --- |
| Total waveguide width | N × W |
| Saturated output $P_{3dB}$ | N times ( 10 Log N dB ) Inprovement |
| Injected current | N times |
| Injected current density | One times |

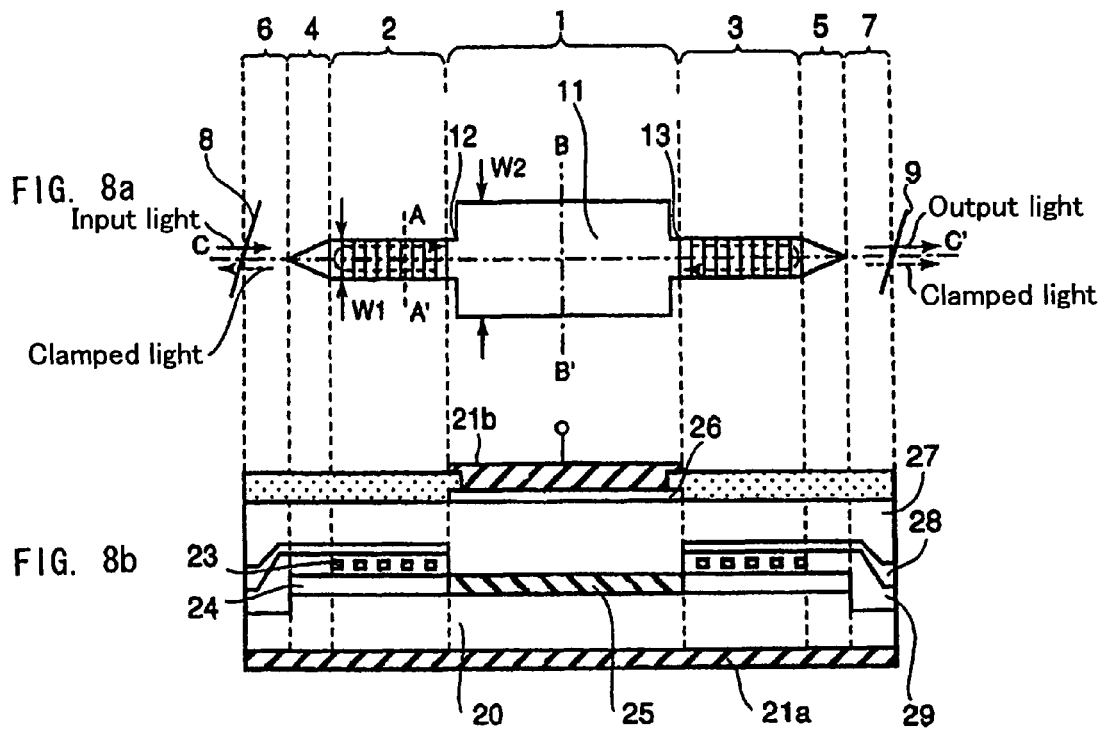
FIG. 8a
FIG. 8b
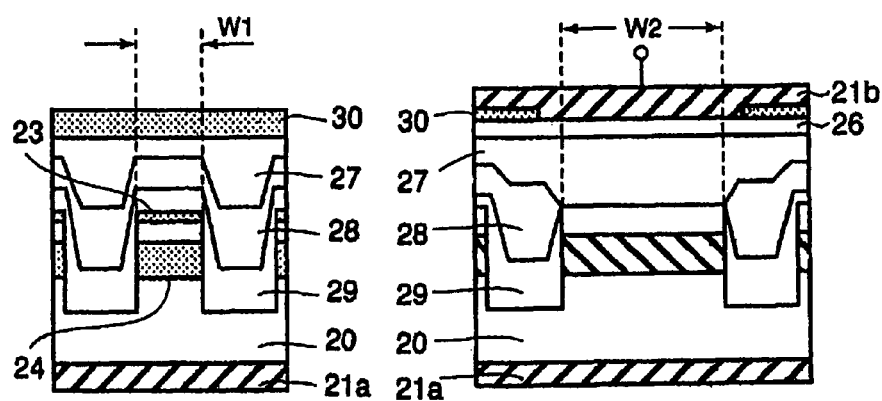
FIG. 8c          FIG. 8d

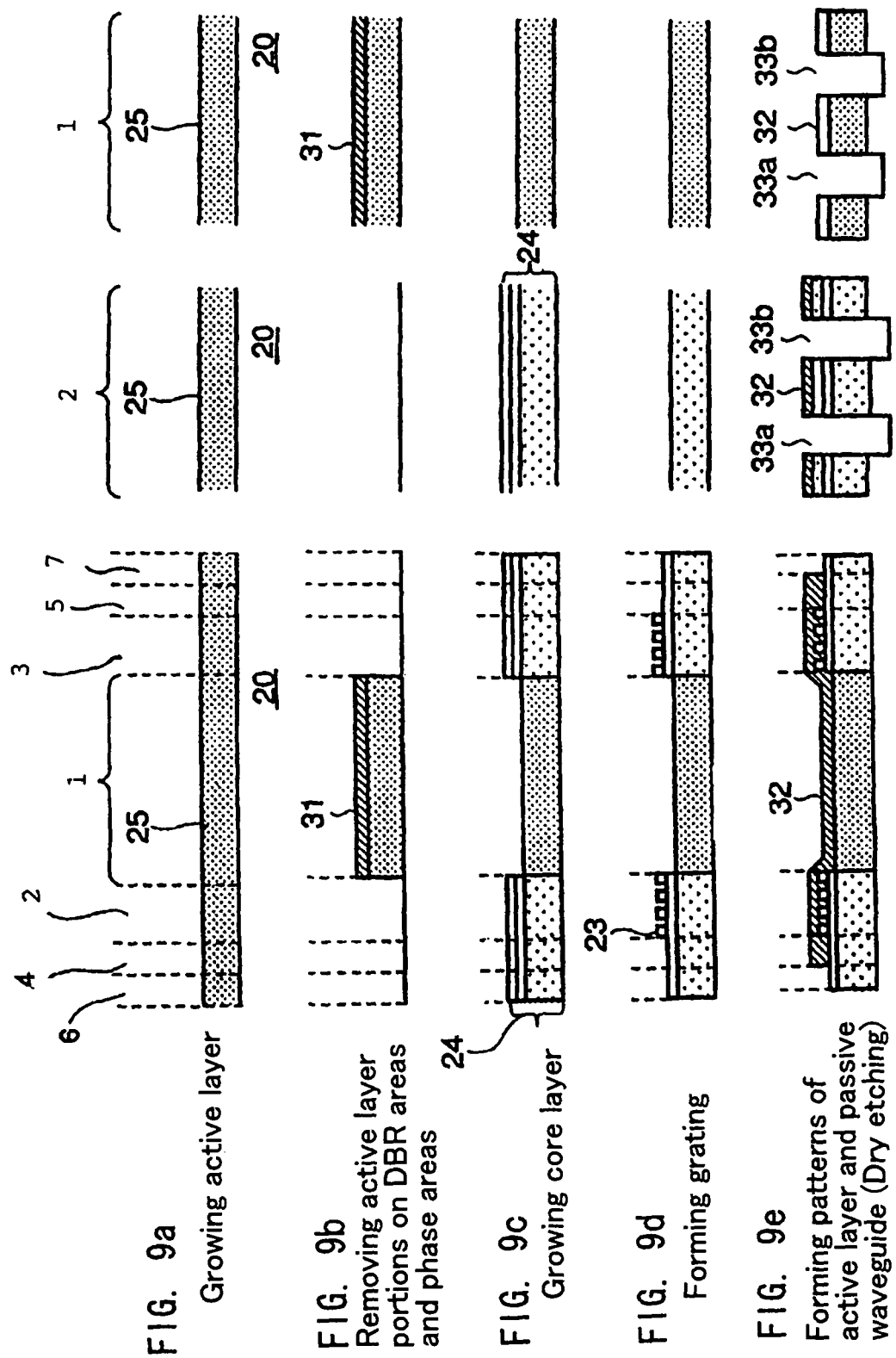

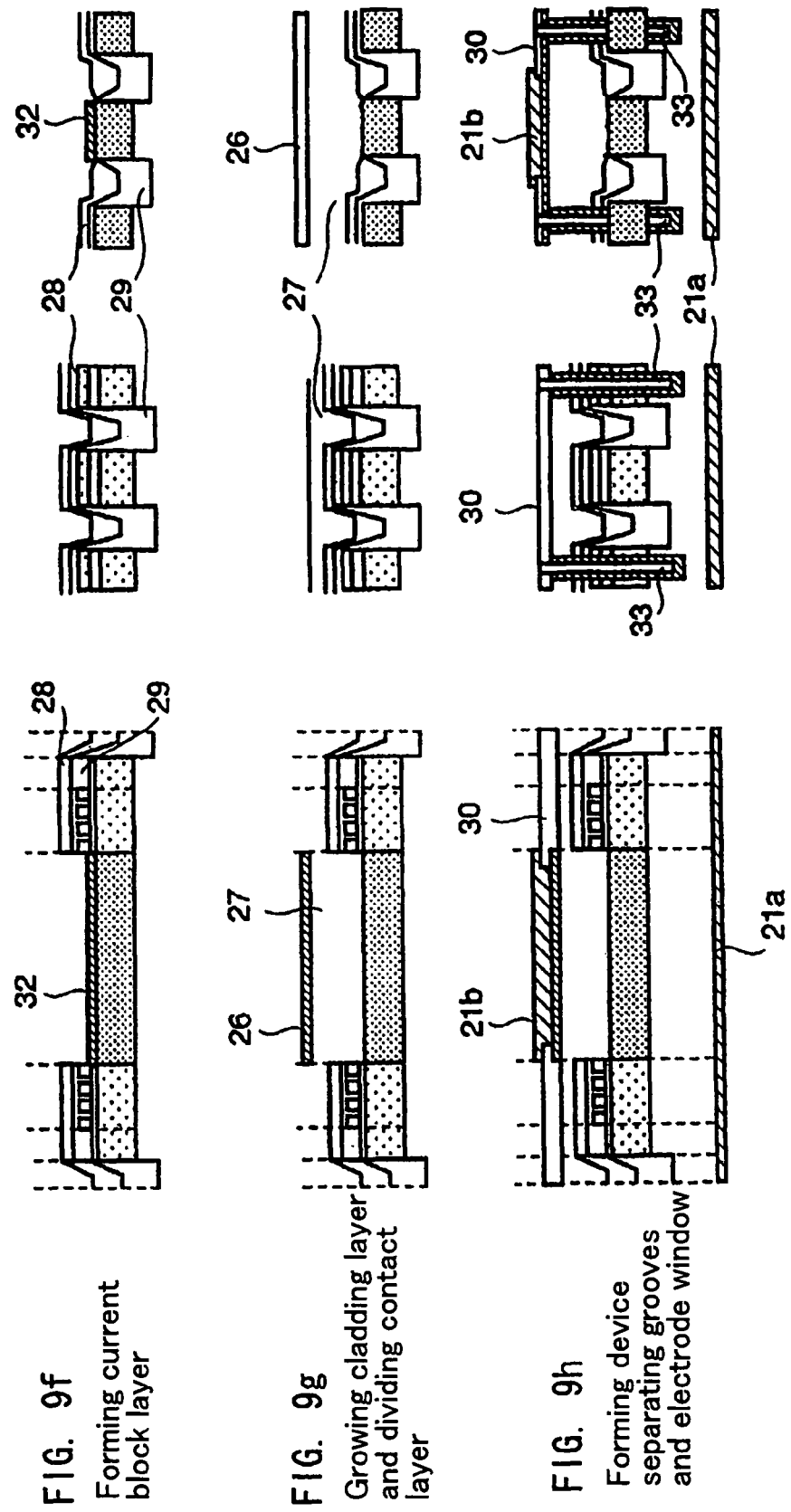
FIG. 9f Forming current block layer
FIG. 9g Growing cladding layer and dividing contact layer
FIG. 9h Forming device separating grooves and electrode window

GAIN-CLAMPED SEMICONDUCTOR OPTICAL AMPLIFIER

TECHNICAL FIELD

The present invention relates to a semiconductor optical amplifier, and more particularly to a gain-clamped semiconductor optical amplifier.

BACKGROUND ART

Semiconductor optical amplifiers (SOAs) are promising as small-size, low-cost optical amplifiers to replace erbium-doped fiber amplifiers (EDFA) that are typically used in conventional optical communication systems.

One of the goals to be achieved with respect to the performance of SOAs is to increase the saturated output. Generally, the maximum optical output of amplified light generated by SOAs is lower than that of EDFAs. At present, SOAs, which are considered to be more advantageous than EDFAs for their smaller sizes and lower costs, have not been available as a substitute for EDFAs. For SOAs to replace EDFAs in large-capacity wavelength-multiplex optical communication systems, the SOAs need to produce a saturated output of at least 20 dBm (100 mW). In efforts to increase the saturated output, care should be taken not to sacrifice general performance details required by optical amplifiers and performance advantages of SOAs, including polarization dependency, drive current, device size, etc.

A general process for improving the saturated output of SOAs is to optimize the structure of an active layer while maintaining the propagation characteristics of a single transverse mode which is indispensable for optical communication devices. A first conventional arrangement of this process, represented by an SOA by K. Morito, et al. (see non-patent document 1: European conference of optical communications'2000 (ECOC'2000) International Meeting, paper 1.3.2), will be described below.

According to the first conventional arrangement, a tensile-strained bulk active layer which can more easily be rendered independent of polarization than a multiple-quantum well (MQW) that is widely used as an active layer in semiconductor lasers is employed, and the thickness of the active layer is reduced to about 50 nm thereby to reduce a light confinement coefficient for confining light in the active layer to about 0.1, so that the internal loss of the active layer is reduced and a waveguide mode cross-sectional area (a light confinement coefficient per unit active layer area) is reduced. This structure makes it possible to achieve such high characteristics as a fiber-to-fiber gain of 19 dB and a fiber saturated output (which is defined as a fiber optical output intensity in the case where the fiber-to-fiber gain is 3 dB lower than the gain G0 when not saturated) of 17.4 dBm under such drive conditions as an injected current of 500 mA and an injected current density of about 30 kA/cm$^2$.

However, it is highly difficult at present to achieve a saturated output of at least 20 dBm through the optimization of the active layer according to the first conventional arrangement, for the following reasons:

1) It is difficult to achieve both a high saturated output and polarization independence.

2) The drive current density is increased.

3) The gain saturation characteristics with respect to a signal light are deteriorated.

The above three factors will be described below in specific detail. With regard to the factor 1), it is necessary to further reduce the waveguide cross-sectional area in order to improve the saturated output. If, however, the waveguide cross-sectional area is to be further reduced to obtain a saturated output of 20 dBm in the first conventional arrangement, the thickness of the active layer needs to be reduced to about 20 nm or less. If the thickness of the active layer is reduced, a crystal strain required for polarization independence will be increased, resulting in crystal growth difficulty. The thin active layer develops a quantum effect, causing the active layer to have characteristics as a multiple-quantum well which is largely polarization-dependent. Therefore, it is difficult to achieve polarization-independent gain characteristics.

With respect to the factor 2), an injected current density in excess of 30 kA/cm$^2$ reported in the first conventional arrangement is required in order to obtain a saturated output of 20 dBm. However, using such a high current density as a drive condition is not practical in view of deteriorated gain characteristics due to heating and device reliability.

With respect to the factor 3), the saturated output performance on dynamic characteristics for amplifying a modulated signal is not yet sufficient. This is a problem caused by the definition of a saturated output which serves as an index for estimating the maximum optical output of an SOA. As described above, the saturated output of an optical amplifier has heretofore been defined generally as a fiber optical output when a gain reduction from an unsaturated gain is 3 dB, and represented by "$P_{3\ dB}$". EDFAs that are typically used in conventional optical communication systems do not cause a signal waveform deterioration, but cause only a gain reduction, when amplifying a signal in the gain saturation range. SOAs, however, cause a signal waveform deterioration when driven in an optical output intensity range with a gain reduction of 3 dB. Such a signal waveform deterioration is due to the essential nature of SOAs that they are susceptible to a gain saturation relaxation process because the carrier relaxation time in the active layer and the bit rate of the signal light are of about the same order of time.

The above waveform deterioration is also reported in the non-patent document 1 cited as representing the first conventional arrangement. The non-patent document 1 illustrates amplified signal waveforms of a signal having a bit rate of 10 Gb/s respectively for optical outputs of 12 dBm and 14 dBm according to the results of an experiment on transmitted signal waveforms at the time a modulated signal is applied. It is reported that a signal waveform deterioration is confirmed when the SOA is driven to produce an optical output of +14 dBm and a slight signal waveform deterioration is observed when the SOA is driven to produce an optical output of +12 dBm.

In view of the above waveform deterioration peculiar to the SOAs, an optical output when a gain reduction from an unsaturated gain is 1 dB is newly defined as a saturated output which does not cause a signal deterioration, and is represented by "$P_{1\ dB}$". $P_{1\ dB}$ in the conventional arrangement is at most about 10 dBm, indicating that a further increase in the saturated output is required.

As described above, it can bee seen that it is highly difficult to achieve a maximum optical output in excess of 20 dBm with the active layer according to the process of optimizing active layer while maintaining the single transverse mode.

There has been proposed a process of solving the 1) and 2) of the above three limitations. According to the proposed process, the input optical intensity per unit active layer area is lowered by increasing the effective width of the active layer while maintaining the optical output in the single transverse mode, using a tapered waveguide or an interference waveguide. Conventional arrangements based on the proposed process will be introduced below.

First, "multi waveguide (MWG)-SOA" disclosed by B. Dagens, et al. (see non-patent document 2: IEEE Electronics Letters, vol. 35, No. 6, pp. 485-487, 1999) is illustrated as a second conventional arrangement. An arrangement and operating principles of an MWG-SOA according to the second conventional arrangement will be described below with reference to FIGS. 1 and 2. As schematically shown in FIG. 1, the MWG-SOA comprises an array of N active layers 200 and passive waveguides 201 disposed at opposite ends of N active layers 200. Each of passive waveguides 201 includes 1×N optical multiplexer/demultiplexer 202. Input light (having intensity Pin) is demultiplexed by optical multiplexer/demultiplexer 202 at the front ends of active layers 200 into N input lights which are applied to respective active layers 200. Each of the input lights which are applied to respective active layers 200 has optical intensity Pin/N. The lights are amplified by respective active layers 200 and then multiplexed by optical multiplexer/demultiplexer 202 at the rear ends of active layers 200 into output light which is emitted. The N optical paths for the respective lights have the same length. Since the N lights propagated through the respective optical paths are multiplexed in phase with each other by rear optical multiplexer/demultiplexer 202, no demultiplexing loss is developed.

FIG. 2 is a graph showing gain saturation characteristics of the device according to the second conventional arrangement. The graph has a horizontal axis representing the intensity of the optical output from the SOA and a vertical axis the device gain, and shows gain saturation characteristics plotted when the number of active layers of the array is 1, 2, and 4. The gain saturation characteristics for N=1 correspond to the characteristics of a conventional SOA in the signal transverse mode. As described above, the gain characteristics of the SOA are such that the gain is a constant unsaturated gain $G_0$ when the input optical intensity is small, but as the input optical intensity increases, the gain drops and the optical output intensity is saturated. In the arrangement shown in FIG. 2, the newly defined optical output "$P_{1\ dB}$" is not employed, but the conventional optical output "$P_{3\ dB}$" is employed. The saturated output for N=1 is indicated by "a" in FIG. 2. When N=2, since the input optical intensity per active layer becomes half, the saturated output of the entire device is indicated by "b" in FIG. 2, and improved twice (=3 dB) the output for N=1. Similarly, when N=4, since the input optical intensity per active layer becomes ¼, the saturated output of the entire device is indicated by "c" in FIG. 2, and improved four times (=6 dB) the output for N=1.

According to the non-patent document 2, it is reported that the saturated output of the SOA in the single mode was improved 5 dB. Though the drive current flowing to the array of N active layers is N times the drive current for N=1, the injected current density for the array of N active layers remains the same as the injected current density for N=1. Therefore, it will be understood that the injected current density is not increased with respect to the difficulty 1) to be eliminated for increasing the saturated output. According to this process, since it is not necessary to reduce the mode cross-sectional area of the active layer, the thickness of the active layer may be of 50 nm which is about the same as the thickness according to the conventional arrangement. Therefore, it will be seen that the problems of the factor 2) referred to above is solved.

Another report on an increased waveguide width for an increased saturated output is shown in "active-MMI (Multimode-interference)—SOA" disclosed by K. Hamamoto, et al. (see non-patent document 3: IEEE Electronics Letters, vol. 36, No. 14, pp. 1218-1220, 2000), which is illustrated as a third conventional arrangement. A planar structure of the device is schematically shown in FIG. 3.

As shown in FIG. 3, the MMI-SOA has single-mode waveguide 101 disposed on device end face 103 to which input light is applied, single-mode waveguide 102 disposed on device end face 104 from which output light is emitted, and multimode interference (MMI) waveguide 100 disposed between these waveguides 101, 102. Each of single-mode waveguides 101, 102 has width W1, and MMI waveguide 100 has width W2 (>W1). The width and length of MMI waveguide 100 are designed such that MMI waveguide 100 functions as a 1×1 multiplexer/demultiplexer based on the propagation principles of the MMI waveguide. Light that is applied from the input-side single-mode waveguide and propagated through MMI waveguide 100 can be taken out again as transverse single-mode light without a demultiplexing loss.

MMI waveguide 100 can reduce the input light density because of a wide active layer thereof, as with the MWG-SOA according to the second conventional arrangement, and is capable of realizing an SOA with a high saturated output. According to the non-patent document 3, it is reported that a saturated output improvement of 5 dB was achieved by an SOA capable of producing a single transverse mode output.

One promising solution to the problem according to the factor 3) to be eliminated for increasing the saturated output is a gain-clamped SOA. The gain-clamped SOA is an SOA incorporating a laser resonator structure therein for amplifying signal light that is applied to a laser-oscillated active layer. The gain-clamped SOA is known as a technology for improving a signal waveform deterioration due to an SOA gain saturation and interchannel crosstalk that is developed when a wavelength-multiplex signal is amplified, to achieve linear gain characteristics which do not depend on the input light intensity. Operation of the gain-clamped SOA will be described below.

FIG. 4 is a diagram illustrative of the gain saturation characteristics of a conventional SOA and a gain-clamped SOA. It is assumed that the conventional SOA and the gain-clamped SOA have the same active layer quality and the same drive current. As already described above with respect to the first and second conventional arrangements, when the SOA drive condition is constant, when the output light intensity is increased, the gain of the SOA is saturated and becomes lower than the unsaturated gain $G_0$.

The gain saturation curve of the conventional SOA is indicated by the broken line in FIG. 4. The saturated output $P_{1\ dB}$ of the SOA is indicated by "a" in FIG. 4. The gain saturation curve of the gain-clamped SOA is indicated by the solid line in FIG. 4. As described above, the gain-clamped SOA has a laser oscillator structure incorporated therein and is actuated in a laser-oscillated state. In the laser-oscillated state, the carrier density in the active layer of the SOA is clamped to the oscillation threshold carrier density of the laser. At this time, the gain of the gain-clamped SOA does not depend on the output light intensity, but is constant as an unsaturated gain $G_{GC}$. The unsaturated gain $G_{GC}$ can be set to a desired level by changing the reflectance of the laser oscillator incorporated in the gain-clamped SOA. According to the gain-clamped SOA, the gain is also saturated when the output light intensity increases. In the gain saturation range, since the number of carriers consumed for amplifying the input light increases, the laser-oscillated state cannot be maintained, shutting off the gain clamping operation. The output light intensity ("b" in FIG. 4) at this time represents a saturated output value $G_{sat}$ of the gain-clamped SOA. Though the saturated output value $G_{sat}$ of the gain-clamped SOA is lower than the unsaturated gain $G_0$ of the conventional SOA with the same quality under the same drive condition, it is possible to obtain a desired gain by designing the active layer in anticipation of such a gain drop.

As described above, the saturated output of the active layer having the same quality is higher with the gain-clamped SOA by "b-a (dB)" than with the conventional SOA, and it will be seen that the limitation of the factor 3) to be eliminated for increasing the saturated output is improved.

A reported arrangement of the gain-clamped SOA is shown in "gain-clamped (GC)—SOA" disclosed by M. Bachmann, et al. (see non-patent document 4: IEEE Electronics Letters, vol. 32, No. 22, pp. 2076-2077, 1996) (fourth conventional arrangement). FIG. 5 schematically shows a device structure of the GC-SOA. The fourth conventional arrangement has a waveguide structure including a resonator for oscillating clamped light, the resonator being disposed in the same optical path in a single-stripe active layer.

As shown in FIG. 5, the GC-SOA has a waveguide structure including distributed Bragg reflectors (DBRs) 111, 112 disposed respectively in the opposite ends of active layer 110 of an SOA. When the SOA is driven by a current injected into active layer 110, a laser oscillation occurs between DBRs 111, 112 at a certain wavelength (e.g., 1.5 µm) depending on their reflection peak, and laser-oscillated light (hereinafter referred to as clamped light) is emitted from entrance and exit ends of the waveguide structure. At this time, since active layer 110 is clamped to the oscillation threshold gain of the clamped light, it can give a constant gain at all times to the input light regardless of the intensity of the input light. This structure requires a filter on the exit end for removing the clamped light because the signal light and the clamped light travel through the same optical path.

Another reported arrangement of the gain-clamped SOA is an SOA (fifth conventional arrangement) disclosed in patent document 1 (Japanese laid-open patent publication No. 2000-77771). FIG. 6 schematically shows a device structure of the fifth conventional arrangement. The fifth conventional arrangement employs a Mach-Zehnder-interferometer waveguide structure for spatially separating signal light and clamped light at entrance and exit ends though the signal light and the clamped light pass through the same active layer. The active layer according to the fifth conventional arrangement corresponds to the structure wherein the number N of arrayed active layers of the SOA according to the second conventional arrangement is 2.

As shown in FIG. 6, the SOA has two ports A, B at one end and two ports C, D at the other end. Port A is an input port to which input light guided through convergent optical fiber 121 is applied. Port D is an output port for emitting output light which is guided outwardly by convergent optical fiber 122. Port B is combined with reflector 123, and port C is combined with reflector 124 and variable light attenuator 125. Ports A, B are connected to respective two input waveguides of optical multiplexer/demultiplexer 126 serving as an optical power equal distributor. Optical multiplexer/demultiplexer 126 has two output waveguides connected to respective two input waveguides of optical multiplexer/demultiplexer 127. These waveguides serve as respective interference arms of a Mach-Zehnder interferometer. Optical multiplexer/demultiplexer 127 has two output waveguides connected to respective ports C, D. The interference arms of the Mach-Zehnder interferometer have SOA units 120a, 120b formed respectively therein.

With the above SOA, input light supplied from port A is equally distributed by optical multiplexer/demultiplexer 126. Lights that are equally distributed by optical multiplexer/demultiplexer 126 are amplified by SOA units 120a, 120b in the interference arms, and then interference-multiplexed by optical multiplexer/demultiplexer 127 into amplified light, which is emitted from port D. When the SOA is driven, a laser oscillation occurs in a path interconnecting ports B, C between reflectors 123, 124, and clamped light is emitted from reflectors 123, 124. In this case, the gain is clamped in the same manner as shown in FIG. 2. Since the path of the signal light (the path interconnecting ports A, D), and the path of the clamped light (the path interconnecting ports B, C) are spatially separate from each other, a filter for removing the clamped light is not required. Therefore, it is expected that the cost of the module may be reduced.

With the structure shown in FIG. 6, the effective reflectance of reflector 124 can be adjusted by variable light attenuator 125 (or variable optical amplifier) disposed in a portion of the path of the clamped light. The structure shown in FIG. 6 is also advantageous in that the clamped light and the signal line may have the same wavelength.

Still another reported arrangement of the gain-clamped SOA is shown in "linear optical amplifier (LOA)" disclosed by D. A. Francis, et al. (see non-patent document 5: Technical digest of Optical Fiber communications 2001 (OFC2001), post deadline paper PD13). FIG. 7 schematically shows a device structure of the LOA. The LOA includes resonators disposed in vertically sandwiching relation to a waveguide through which signal light is propagated.

As shown in FIG. 7, active layer 131 having a waveguide structure is disposed in a substrate surface of InP substrate 130, and InP cladding 132 covering active layer 131. InP substrate 130 on which active layer 131 and InP cladding 132 are disposed is vertically sandwiched by a pair of DBRs 133, 134. The LOA is of a vertical cavity surface emitting laser (VCSEL) structure which is laser-oscillated in a direction perpendicular to the substrate surface.

With the above LOA, signal light is guided through waveguide-structure active layer 131 disposed in the substrate surface of InP substrate 130. DBRs 133, 134 disposed above and below active layer 131 cause a laser oscillation in the direction perpendicular to the substrate surface of InP substrate 130, emitting clamped light upwardly and downwardly of InP substrate 130. Though the LOA is of a single-stripe structure, it has separate optical paths of the signal light and the clamped light. Therefore, as with the SOA shown in FIG. 6, the LOA does not need a filter for removing the clamped light.

The features of the conventional designs have briefly been described above. Difficulties to be eliminated by the present invention are summarized as follows:

As described above, it is highly difficult to achieve a saturated output of at least 20 dBm mainly through the optimization of the active layer for the following reasons: 1) It is difficult to achieve both a high saturated output and polarization independence. 2) The drive current density is increased. 3) The gain saturation characteristics with respect to a signal light are deteriorated.

The process a) of improving the difficulties 1), 2) by increasing the effective waveguide width using an interference waveguide, and the process b) of improving the difficulty 3) with the gain-clamped SOA have been described above as conventional techniques. For achieving a saturated output in excess of 20 dBm in view of the required drive current, the above improvements a), b) still have problems to be solved. The reasons for those problems will be described below.

First, the problems of the process a) of improving the difficulties 1), 2) by increasing the effective waveguide width while maintaining a single transverse mode output will be described below. As described above with respect to the conventional arrangements, if the effective waveguide width can be increased N times the width W of the active layer for conventional single transverse mode propagation according to the present process, then the saturated output is improved N times. At this time, the injected current density remains the same. To achieve these characteristics, however, a drive current which is N times the drive current in the conventional SOA is required. A drive current of an SOA having a waveguide width of N×W when the saturate output $P_{1\,dB}$ is 20 dBm is estimated to be about 2 A. This drive current is higher than the drive current of an LD for exciting an EDFA. It can be seen that because of the drive current, the present process is not sufficient for realizing an SOA which can be used as a substitute for an EDFA.

The process b) of improving the difficulty 3) with the gain-clamped SOA will be described below. As described above with respect to the conventional arrangement, the gain-clamped SOA can produce a higher saturated output than the conventional SOA even if they have active layers of the same quality. Therefore, if the same target saturated output value is to be achieved, then the gain-clamped SOA has a smaller drive current than the conventional SOA. However, inasmuch as the gain saturation curve itself is not improved by employing the gain-clamped SOA, the saturated output is improved by a value within the range of the gain saturation curve of the active layer which is not associated with gain clamping.

It is an object of the present invention to provide an SOA which has a high saturated output in excess of 20 dBm that has been difficult to achieve with the conventional SOA and which has such practical performance that it can be used as a substitute for an EDFA.

DISCLOSURE OF THE INVENTION

To achieve the above object, a gain-clamped semiconductor optical amplifier according to the present invention has a pair of reflectors disposed in sandwiching relation to a gain area for amplifying guided light, wherein a portion of a waveguide of the gain area comprises a multimode interference optical waveguide. With this arrangement, laser oscillation is caused by the reflectors to clamp a gain in the gain area to an oscillation threshold gain. Therefore, a degradation of a signal waveform due to a gain saturation and interchannel crosstalk upon amplification of wavelength-multiplexed signal light are suppressed. Since the portion of the waveguide of the gain area comprises a multimode interference optical waveguide, the area of the gain area (active layer) is increased, resulting in a corresponding reduction in the density of input light applied to the gain area (active layer) for an increased saturated output.

The above gain-clamped semiconductor optical amplifier may further include a first port for receiving external signal light, and a second port for emitting light which has been amplified by the gain area, wherein the multimode interference optical waveguide may have a waveguide end face connected to the first port through a first single mode waveguide and another waveguide end face connected to the second port through a second single mode waveguide, and one of the reflectors may be disposed in the first single mode waveguide, and the other of the reflectors is disposed in the second single mode waveguide.

The above gain-clamped semiconductor optical amplifier may further include a first port for receiving external signal light, a second port for emitting light which has been amplified by the gain area, and third and fourth ports for emitting clamped light generated by the reflectors, wherein the multimode interference optical waveguide may have a waveguide end face connected to the first port through a first single mode waveguide and connected to the third port through a second single mode waveguide, and another waveguide end face connected to the second port through a third single mode waveguide and connected to the fourth port through a fourth single mode waveguide, and one of the reflectors may be disposed in the second single mode waveguide, and the other of the reflectors may be disposed in the fourth single mode waveguide. With this arrangement, since a propagation path for the clamped light and a propagation path for the signal light are spatially separate from each other, there is no need for a filter for separating the clamped light from the signal light, and the signal light and the clamped light may have the same wavelength.

In the gain-clamped semiconductor optical amplifier, a portion of the second or fourth single mode waveguide may comprise a gain adjusting waveguide for adjusting the an oscillation threshold gain of the clamped light. With this arrangement, the gain of the signal light can be adjusted by adjusting the oscillation threshold gain.

The gain-clamped semiconductor optical amplifier may further include a photodetector for detecting the clamped light emitted from the third or fourth port. With this arrangement, if the gain-clamped semiconductor optical amplifier is applied to a repeater amplifier, then the gain-clamped semiconductor optical amplifier operates as described above, and can also operate to produce a constant output by controlling the amount of a current injected into or a voltage applied to the gain adjusting waveguide in order to make the output of the photodetector constant. If the gain-clamped semiconductor optical amplifier is applied to a receiver in an optical communication system, then since the amplified clamped light is detected instead of the signal light, an error rate of signal conversion can be lowered.

The gain-clamped semiconductor optical amplifier may further include a photodetector for detecting the light emitted from the second port. With this arrangement, the gain-clamped semiconductor optical amplifier operates as described above, and can also lower an error rate of signal conversion.

BRIEF DESCRIPTION OF THE DRAWINGS

FIG. 8*a* is a plan view of a structure of a gain-clamped semiconductor optical amplifier according to a first embodiment of the present invention;

FIG. 8*b* is a cross-sectional view taken along line C-C' of the structure shown in FIG. 8*a;*

FIG. 8*c* is a cross-sectional view taken along line A-A' of the structure shown in FIG. 8*a;*

FIG. 8d is a cross-sectional view taken along line B-B' of the structure shown in FIG. 8a;

FIGS. 9a through 9h are views showing a process of successive steps for manufacturing the gain-clamped semiconductor optical amplifier shown in FIGS. 8a through 8d;

FIG. 10a is a plan view of a structure of a gain-clamped semiconductor optical amplifier according to a second embodiment of the present invention;

FIG. 10b is a cross-sectional view taken along line C-C' of the structure shown in FIG. 10a;

FIG. 12a is a plan view of a structure of a gain-clamped semiconductor optical amplifier according to a fourth embodiment of the present invention;

FIG. 12b is a cross-sectional view taken along line C-C' of the structure shown in FIG. 12a;

BEST MODE FOR CARRYING OUT THE INVENTION

Figure 1:
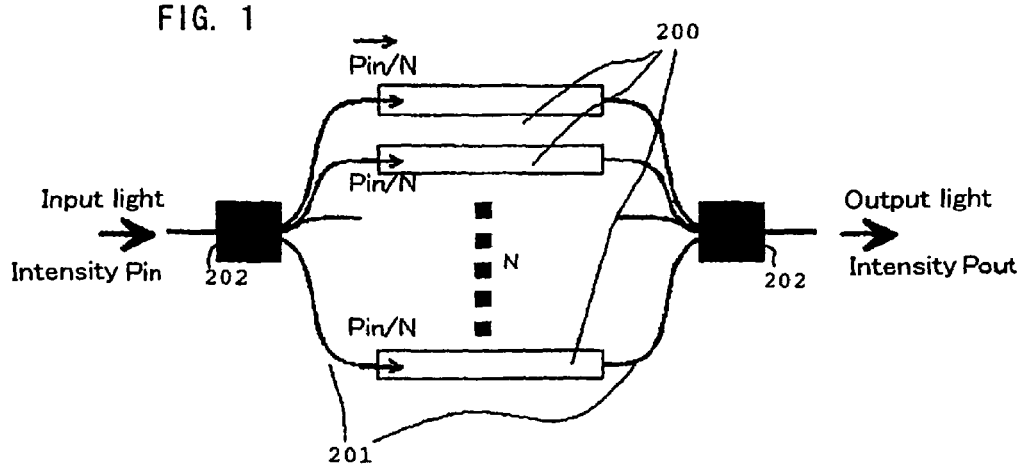
FIG. 1 is a schematic plan view of a device structure of a conventional semiconductor optical amplifier.

Preferred embodiments of the present invention will hereinafter be described in detail below with reference to the drawings.

First, the reasons why the present invention is capable of realizing an SOA having a high saturated output in excess of 20 dBm which is a general indicator for use as a substitute for an EDFA, without significantly impairing general performance details required by optical amplifiers and performance advantages of SOAs (polarization dependency, drive current, device size, etc.), will be described below.

As described above with respect to the conventional arrangements, an SOA based on a conventional waveguide structure for single transverse mode propagation and having an active layer whose mode cross-sectional area is optimized finds it difficult to achieve a high saturated output in excess of 20 dBm. It is also difficult to achieve a high saturated output in excess of 20 dBm with either one of a) an SOA with an increased effective waveguide width for maintaining a single transverse mode output, and b) a gain-clamped SOA, both described above as conventional techniques that are considered to be effective to increase the saturated output. According to the present invention, there is proposed an SOA based on a combination of the above arrangement a) which is capable of improving the gain saturation curve and the above arrangement b) which makes the drive current efficient for obtaining a desired saturated output. Several processes including the conventional arrangements have been proposed for both the arrangements a), b). In efforts to accomplish the present invention, the following study has been made to find an optimum structure:

First, optimum approaches for a) an SOA with an increased effective waveguide width for maintaining a single transverse mode output have been studied. The results of the study are shown in Table 1 below.

TABLE 1

| | Approach to | | | | Evaluation | | |
| --- | --- | --- | --- | --- | --- | --- | --- |
| Type | increased waveguide width | Multiplexer function | Plan view of device structure | Report | Device size | Yield (PDL, number of steps) | Total judgement |
| A | Array waveguide | Passive | 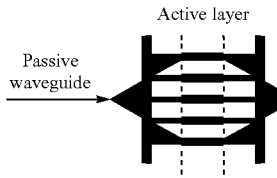 | Conventional arrangement 2, Patent document 1 (Conventional arrangements 2, 5) | 1 | 1 | 1 |
| B | Array waveguide | Active | 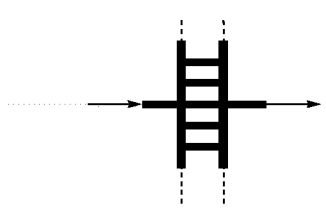 | None | 3 | 2 | 2.5 |

TABLE 1-continued

| Type | Approach to increased waveguide width | Multiplexer function | Plan view of device structure | Report | Evaluation Device size | Yield (PDL, number of steps) | Total judgement |
|---|---|---|---|---|---|---|---|
| C | MMI | Passive | 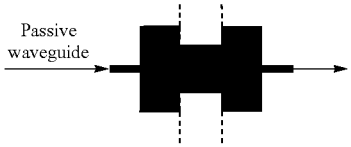 Passive waveguide | Patent document 2 | 3 | 4 | 3.5 |
| D | MMI | Active | 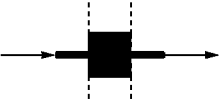 | Non-patent document 3 (Conventional arrangement 3) | 5 | 5 | 5 |
| E | Directional coupler | Active | 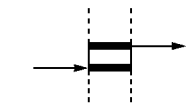 | None | 3 | 3 | 3 |
| F | Tapered waveguide | Active |  | None | 3 | 4 | 3.5 |

Table 1 shows six types A through F proposed as device structures applicable to the present invention and evaluations of those types as to their adaptability to the present invention from the standpoints of device sizes and productivity aspects (yield and the number of manufacturing steps). The types A through F differ from each other primarily with respect to 1) means for increasing the waveguide width and 2) optical multiplexer function (whether they are a gain waveguide or a passive waveguide). Features of the types A through F will be described in detail below.

Type A has an "array waveguide active layer+passive optical multiplexer" structure which employs active layers in the form of an array waveguide as a means for widening a waveguide and 1×N optical multiplexer/demultiplexers each comprising a passive waveguide, i.e., the structure according to the first conventional arrangement. Type A is required to increase the number N of active layers of the array waveguide in order to increase an effective waveguide width for an increased saturated output. However, if the number N of active layers is increased, then the sizes of the optical multiplexer/demultiplexers at the opposite ends of the array of active layers are also increased. Therefore, Type A is problematic with respect to the reduction of the device size. Furthermore, since passive waveguides and active layers which are fabricated by different processes need to be integrated together, the number of fabricating steps required is large. If the number N of active layers is large, then it is difficult to bring signals passing through the respective active layers into phase with each other, tending to reduce the device gain and the device yield.

Type B has an "all-active-layer array waveguide" structure which employs active layers in the form of an array waveguide as a means for widening a waveguide and 1×N optical multiplexer/demultiplexers each comprising an active layer. As with Type A, Type B is required to increase the number N of active layers of the array waveguide in order to increase an effective waveguide width for an increased saturated output. However, unlike Type A, since the optical multiplexer/demultiplexers double as active layers, the device size is much smaller than the device size of Type A. If the number N of active layers is large, then it is difficult to bring signals passing through the respective active layers into phase with each other, tending to reduce the device gain and the device yield, as with Type A.

Type C has an "MMI active layer+passive optical multiplexer/demultiplexers" structure which employs an active layer comprising an MMI as a means for widening a waveguide and 1×N optical multiplexer/demultiplexers each comprising a passive waveguide. One conventional arrangement of the Type C device is reported in "WO96/13084" (hereinafter referred to as patent document 2). According to the patent document 2, an MMI is employed as an active layer of a gain-clamped SOA, and one light path of the 2×2-branched MMI serves as a clamped light propagation path and the other light path as a signal light propagation path. The optical multiplexer/demultiplexers, which comprise passive waveguides for multiplexing clamped light and signal light, are disposed respectively at the opposite ends of the MMI active layer. According to this structure, an active layer is employed only in an area wherein signal light and clamped light share one propagation path, an optical multiplexer area wherein the signal light propagation path and the clamped light propagation path are not in spatial alignment with each other is constructed as a passive optical waveguide, thereby promoting mutual gain modulation between the signal light and the clamped light. The patent document 2 proposes another way of promoting mutual gain modulation between the signal light and the clamped light by reducing the width of the MMI active layer. However, the proposed structure is detrimental to attempts to increase the saturated output. Increasing the saturated output requires that the waveguide width be increased to lower the density of photons in the active layer. Type C which employs the MMC as the active layer may have a smaller device length for obtaining the same active layer width than types A, B. In addition, Type C has a greater tolerance for lithographic errors upon fabrication of the active layer and a higher yield than types A, B which comprise an array of single transverse mode waveguides. However, because the optical multiplexer/demultiplexers of Type C comprise passive waveguides, the device size of Type C is greater than ordinary SOAs. Furthermore, since passive waveguides and active layers which are fabricated by different processes need to be integrated together, the number of fabricating steps required is large.

Type D has an "all-active-layer MMI" structure having an active layer which comprises an MMI as a means for widening a waveguide and 1×N optical multiplexer/demultiplexers each comprising an active layer. As with Type C, Type D may have a smaller device length for increasing the device width than types A, B. In addition, as with Type C, Type D has a greater tolerance for lithographic errors upon fabrication of the active layer and a higher yield than types A, B which comprise an array of single transverse mode waveguides. Since the optical multiplexer/demultiplexers of Type D double as active layers, the device size is much smaller than the device size of Type C. Though there is concern that Type D promotes less mutual gain modulation between the signal light and the clamped light than Type C, any degradation of the signal light is considered to be small because the signal light and the clamped light act mutually on each other through carrier diffusion in the active layer having a waveguide width of 10 μm or less that is actually used.

Type E has an "all-active-layer directional coupler" structure which employs a directional coupler as a means for widening a waveguide, with all coupling waveguides comprising an active layer. Type E is designed such that the length of the active layers of the directional coupler is a full coupling length. The full coupling length represents a propagation distance that is required for the field of signal light which has entered one of the coupling waveguides to shift fully to the other coupling waveguide. With the structure of Type E, the effective waveguide width can be increased by the coupling waveguides. However, since the directional coupler generally comprises two coupling waveguides and the effective waveguide width is limited to a twofold value, the room for an increased saturated output is restricted. Furthermore, because Type E is of a structure based on a simple transverse mode waveguide as with types A, B, Type E is susceptible to lithographic errors upon fabrication of the active layers, and possibly suffers a yield reduction.

Type F has an "all-active-layer tapered waveguide" structure which employs tapered waveguides as a means for widening a waveguide, with all the waveguides comprising an active layer. Type F has an active layer shape composed of joined tapered waveguides having a sufficiently small angle in the signal propagating direction so as not to excite a transverse high-order mode of the signal light. Structures for increasing the active layer width with tapered waveguides have heretofore been developed primarily for use in high-output LD applications. Since the active layer of Type F is provided by a single wide waveguide as with the MMI active layer of types C, D, Type F has a great tolerance for lithographic errors upon fabrication of the active layer and a high yield. For increasing the waveguide width without increasing a waveguide loss, it is necessary to increase the taper angle of the waveguide width. However, it is difficult for Type F to increase the taper angle. Therefore, Type F is problematic in that the active layer length for obtaining a desired waveguide width is large, resulting in an increased device size.

Based on the above analysis, evaluation results shown in Table 1 were obtained with respect to the active layers of 6 types A through F. In Table 1, the highest evaluation level is represented by "5". It can be seen from the evaluation results that the "all-active-layer MMI" of Type D which has the active layer capable of increasing the waveguide width for increasing the saturated output is the most suitable.

Gain-clamping structures have then been studied. Gain-clamping structures that can be conceived include structures in which signal light and clamped light are propagated on the same substrate plane (fourth and fifth conventional arrangements) and a structure in which signal light and clamped light have propagation paths that are perpendicular to each other (sixth conventional arrangement). An excellent one of these three gain-clamping structures in view of high a saturated output, a low power consumption, a small size, and consistency with an active layer structure for widening a waveguide width that has been studied above, has been examined.

Figure 2:
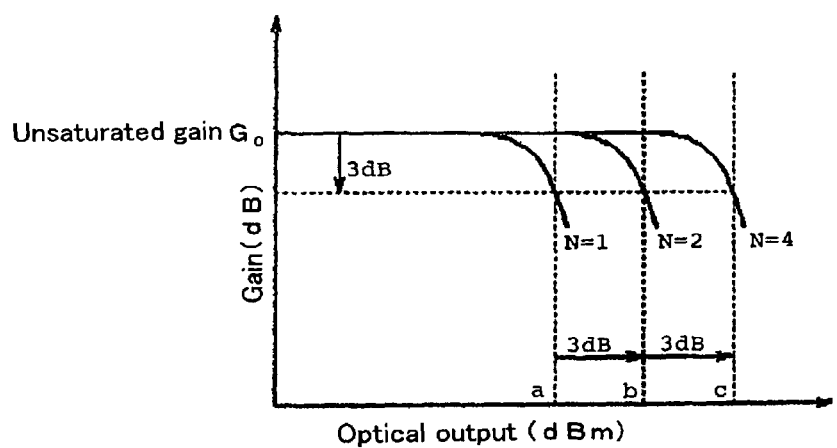
FIG. 2 is a diagram showing the operating principle of the conventional semiconductor optical amplifier.
Figure 3:
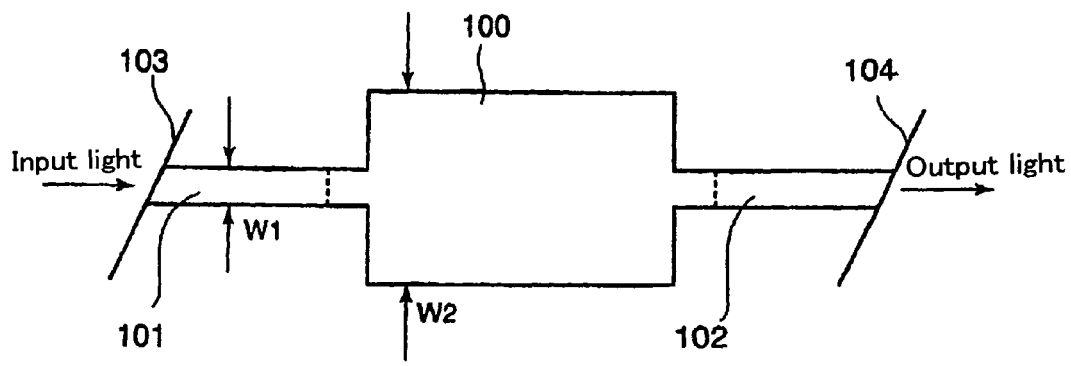
FIG. 3 is a schematic plan view of a device structure of a conventional semiconductor optical amplifier.
Figure 4:
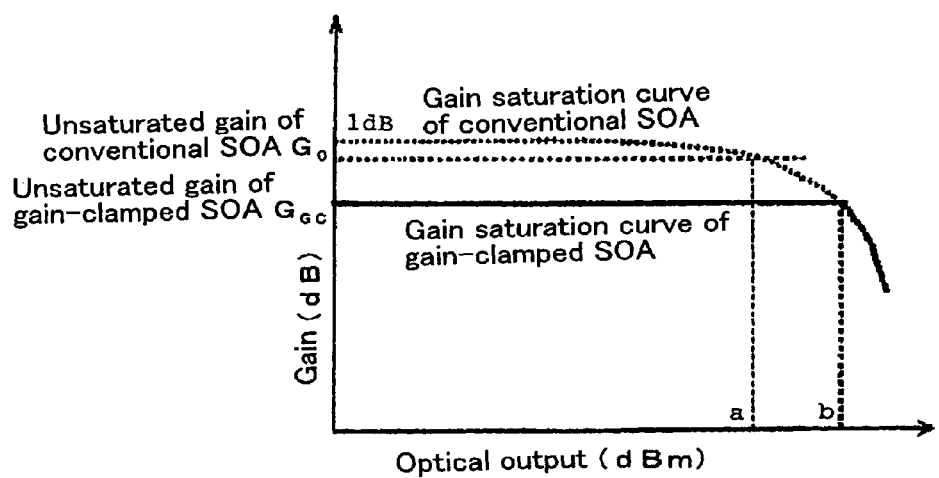
FIG. 4 is a diagram showing the operating principle of a gain-clamped semiconductor optical amplifier.
Figure 5:
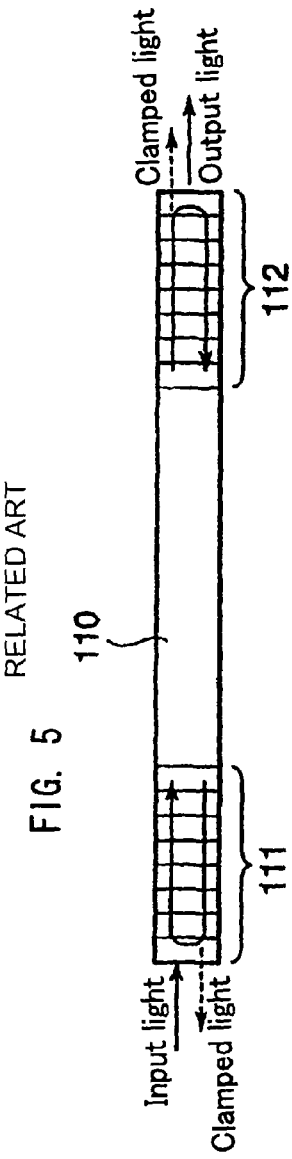
FIG. 5 is a schematic plan view of a device structure of a conventional gain-clamped semiconductor optical amplifier.
Figure 6:
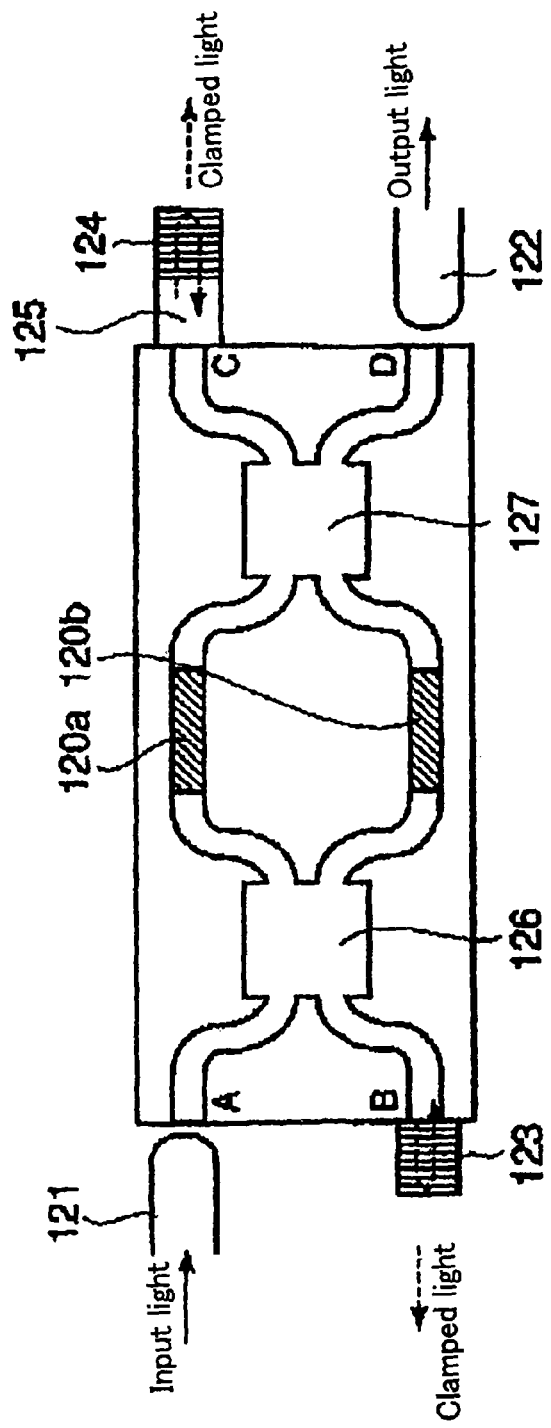
FIG. 6 is a schematic plan view of a device structure of a conventional gain-clamped semiconductor optical amplifier.
Figure 7:
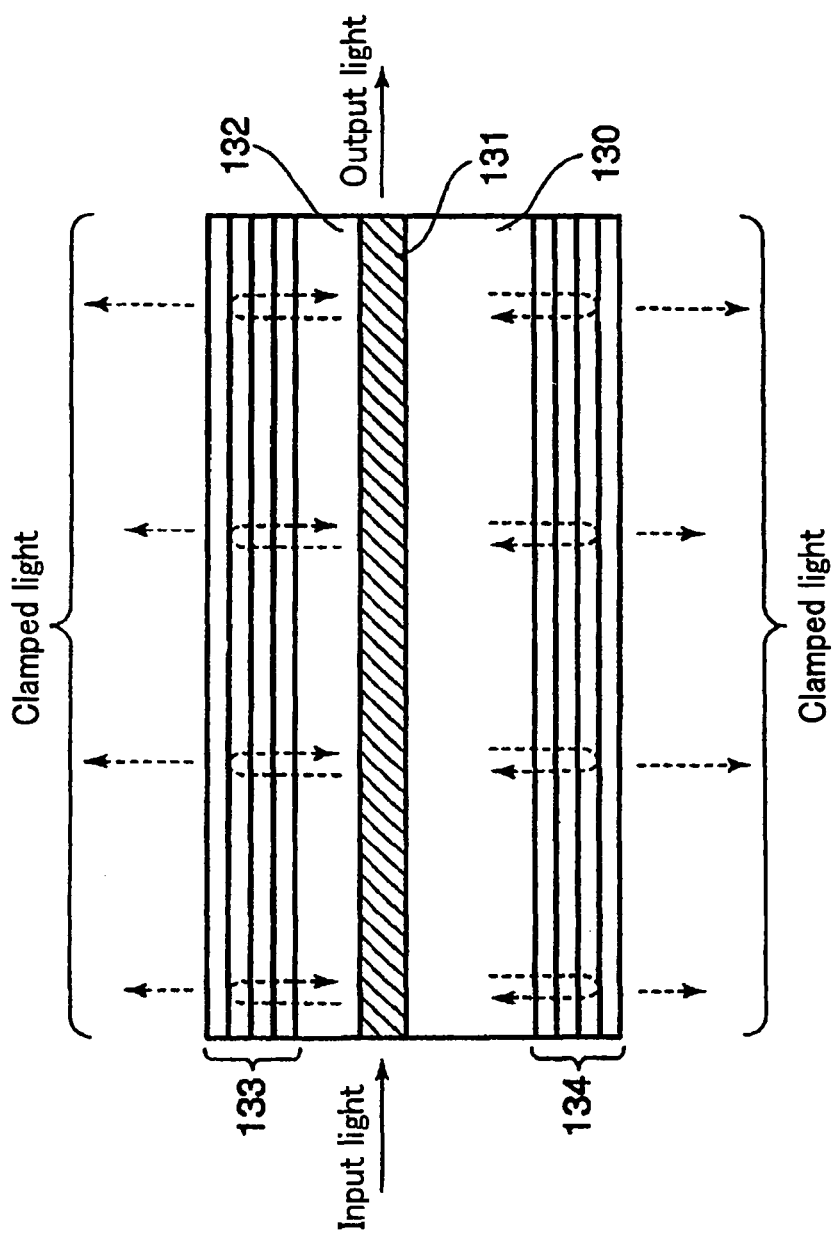
FIG. 7 is a schematic plan view of a device structure of a conventional gain-clamped semiconductor optical amplifier.

A gain-clamped SOA according to a first process (see FIG. 2) may be of a structure 1A) in which the propagation paths of signal light and clamped light are on the same substrate plane and are identical in the substrate plane, or a structure 1B) in which the propagation paths of signal light and clamped light are on the same substrate plane and but different in the substrate plane.

The structure 1A) is applicable to the present invention as it has a simple SOA device structure and poses no problems on the device characteristics even if the active layer comprises an MMI waveguide. According to the structure 1A), the device gain is fixed because the DBRs 111, 112 have fixed reflectances. Furthermore, since the propagation paths of signal light and clamped light are completely identical to each other, an optical filter for removing the clamped light at the output end is required.

The structure 1B) is a structure in which the propagation paths of signal light and clamped light are spatially separated from each other by employing a Mach-Zehnder interferometer or the like, as shown by the fourth conventional arrangement. The structure 1B) needs a two-input, two-output interferential waveguide structure for its implementation. A two-input, two-output interferential waveguide structure can be realized in Types A through E which are capable of increasing the waveguide width. In particular, if the all-active-layer MMI structure of Type D is employed, then a small-size, simple two-input, two-output structure can be realized. The structure B) makes it possible to vary the gain of signal light by providing an active layer and a light absorption layer which are capable of controlling a waveguide gain and loss, in the propagation path of clamped light. This is because the carrier density in the active layer upon oscillation of the clamped light can be varied as the reflectances of the reflectors disposed at the opposite ends of the propagation path of the clamped light can effectively be varied by the active layer and the light absorption layer. Furthermore, inasmuch as the propagation paths of signal light and clamped light are different from each other, an optical filter for removing the clamped light at the output end is not required. The present gain-clamping structure is also applicable to the present invention.

As described above, the gain-clamped SOA according to the first process is of a structure suitable for the object of the present invention.

A gain-clamping structure according to a second process is a structure in which the propagation paths of signal light and clamped light are perpendicular to each other, as shown by the fourth conventional arrangement. According to the second process, since reflectors for oscillating clamped light are disposed above and below the waveguide, the second process is applicable to either one of the active layer structures of Types A through E regardless of the planar shape of the waveguide. However, the second process requires a high gain in the direction perpendicular to the substrate because of the need for laser oscillation in the direction perpendicular to the substrate. To meet such a requirement, it is necessary to thicken the active layer or introduce an active layer of a multiple-quantum well (MQW). Increasing the gain in the direction perpendicular to the substrate means increasing a waveguide mode gain for signal light that is propagated through the substrate plane, which is a design approach that is entirely contrary to the purpose of increasing a saturated output for signal light. Therefore, the gain clamping structure according to the second process is not suitable for the purpose of increasing a saturated output. The reflectors disposed above and below the waveguide pose a limitation on a gain design for making signal light independent of polarization. The gain clamping structure according to the second process is disadvantageous in that the gain is fixed because it is difficult to tune an oscillation threshold gain. The above disadvantages make it difficult to apply the gain clamping structure according to the second process to the present invention.

It has been found as the result of the above examinations that an SOA having a gain clamping structure which comprises an "all-active-layer MMI" waveguide structure in which signal light and clamped light are propagated on the same substrate plane is most excellent as an SOA having a high saturated output, a small size, and a low power consumption according to the present invention.

Embodiments of the present invention will be described below with reference to the drawings.

1st Embodiment

FIG. 8a is a plan view of a structure of a gain-clamped SOA according to a first embodiment of the present invention, FIG. 8b is a cross-sectional view taken along line C-C' of the structure shown in FIG. 8a, FIG. 8c is a cross-sectional view taken along line A-A' of the structure shown in FIG. 8a, and FIG. 8d is a cross-sectional view taken along line B-B' of the structure shown in FIG. 8a;

The structure of a waveguide of the gain-clamped SOA according to the present embodiment will be described below with reference to FIG. 8a. As shown in FIG. 8a, the gain-clamped SOA according to the present embodiment has waveguides extending from device end face 8 to which input light is applied to a device end face 9 from which output light is emitted. The waveguides are of a structure having window area 6, SSC (spot size converter) area 4, DBR area 2, gain area 1, DBR area 3, SSC area 5, and window area 7 which are successively arranged from device end face 8. The waveguides closer to device end face 8 and the waveguides closer to device end face 9 are symmetrical with respect to gain area 1 at the center. Each of DBR areas 2, 3 and SSC areas 4, 5 comprises a single transverse mode waveguide.

Gain area 1 comprises MMI waveguide 11 and single mode waveguides 12, 13 disposed respectively on opposite ends thereof. MMI waveguide 11 is arranged such that light applied thereto from single mode waveguide 12 is propagated through a multimode area and thereafter optically coupled to single mode waveguide 13 with a very low loss based on an interferential effect. MMI waveguide 11 thus has the structure of one-input, one-output (1×1) MMI coupler.

Gain area 1 has a length (waveguide length) of about 600 μm covering both MMI waveguide 11 and single mode waveguides 12, 13. DBR areas 2, 3 have identical lengths of about 10 μm. SSC areas 4, 5 also have identical lengths of about 150 μm. Window areas 6, 7 also have identical lengths of about 150 μm.

The single mode waveguides of DBR areas 2, 3 and single mode waveguides 11, 12 of gain area 1 have identical widths W1 of 1.0 μm. MMI waveguide 11 of gain area 1 has a width (W2) of 6 μm. The waveguide of SSC area 4 is of a tapered shape whose width is progressively smaller toward device end face 8, and has a waveguide width of 1.0 μm at its boundary with DBR area 2 and a waveguide width of 0.5 μm at its boundary with window area 6. Similarly, the waveguide of SSC area 5 is of a tapered shape whose width is progressively smaller toward device end face 9, and has a waveguide width of 1.0 μm at its boundary with DBR area 3 and a waveguide width of 0.5 μm at its boundary with window area 7.

An MMI theory in an active layer will briefly be described below. The MMI theory is concerned with the propagation characteristics of light that has entered a multimode waveguide, and is generally known as a theory for designing a 1×N or N×N demultiplexer/multiplexer waveguide (passive optical waveguide) (e.g., see Lucas B. Soldano, "Journal of Lightwave Technology", Vol. 13, No. 4, pp. 615 to 627, 1995). According to the theory, after incident light has been propagated through a multimode waveguide over a certain distance (MMI area length L) that is determined by the waveguide shape, the refractive index, and the wavelength of the incident light, a self-projected image of the incident light can be obtained. At this time, no demultiplexing and multiplexing loss is developed though a slight mode conversion loss occurs. An MMI waveguide which is designed to obtain a self-projected image of incident light without any demultiplexing and multiplexing loss will hereinafter be referred to as (one-input, one-output) 1×1 MMI waveguide.

Under general incident conditions, the MMI area length L is given as:

$$L=(3L\pi)\times m \text{ ($m$ is an integer)}.$$

If horizontally symmetrical light is applied to the center of the MMI waveguide, then the MMI area length L is given as:

$$L=(3L\pi/4)\times m \text{ ($m$ is an integer)}.$$

If incident light is applied to coordinates where an effective MMI waveguide width We is divided into three segments, then the MMI area length L is given as:

$$L=(L\pi)\times m \text{ ($m$ is an integer)}$$

where $L\pi=(4\cdot nr\cdot We^2)/(3\cdot \lambda_0)$, $$We=WM+(\lambda_0/\pi)\cdot(nc/nr)^{2\sigma}\cdot(nr^2-nc^2)^{-(1/2)},$$

WM represents the physical width of the MMI area, nr the refractive index of the waveguides, nc the refractive index of the cladding, $\lambda_0$ the wavelength of the incident light, and σ=0 when in the TE mode and σ=1 when in the TM mode.

According to the MMI theory, the MMI waveguide operates as a 1×N optical coupler capable of equally distributing the optical output under the condition of a propagation distance LN which satisfies:

$$LN=L\times m/N \text{ ($m$ is an integer)}$$

where N represents a positive integer which may be 1.

Utilizing the above principles, it is possible to design a 1×1 MMI waveguide which comprises a wide multimode optical waveguide, but nevertheless is of a structure for propagating only single transverse mode light at the opposite end faces. MMI waveguide 11 of gain area 1 is constructed as such a 1×1 MMI waveguide. Though the summary of the MMI theory has been illustrated above, details of the principles and definitions are in accordance with the above document.

Cross-sectional structures of the gain-clamped SOA according to the present embodiment will be described below with reference to FIGS. 8b through 8d.

Active layer 25 is disposed on the substrate surface of InP substrate 20 in an area corresponding to gain area 1, providing MMI waveguide 11 and single mode waveguides 12, 13. Core layer 24 serving as a waveguide is disposed on the substrate surface of InP substrate 20 in an area corresponding to DBR area 2 and SSC area 4, and similar core layer 24 is also disposed on the substrate surface of InP substrate 20 in an area corresponding to DBR area 3 and SSC area 5. The waveguides extending from device end face 8 to device end face 9 are of a so-called butt-joint structure in which core layers 24 and active layer 25 are butt-joined in the same substrate plane.

Active layer 25 is of a laminated structure comprising, for example, an n-InP buffer layer, a lower SCH (Separate Confinement Hetero-structure) layer made of InGaAs having a wavelength composition of 1.2 µm, an active layer made of InGaAs having a tensile strain ranging from about −0.2 to −0.3%, an upper SCH layer made of InGaAs having a wavelength composition of 1.2 µm, and an n-InP layer. Each of core layers 24 comprises an n-InP buffer layer, an InGaAsP bulk layer having a wavelength composition of 1.3 µm, and a p-InP layer. Each of DBR areas 2, 3 includes diffraction grating 23 having the same composition as the InGaAsP bulk layer and having a periodic and intermittent pattern in the light guiding direction.

The waveguides composed of core layers 24 and active layer 25 are covered entirely with a semiconductor layer including p-InP cladding layer 27 and p-InGaAs contact layer 26. p-InGaAs contact layer 26 is disposed in an area corresponding to gain area 1, and has on its upper surface p-electrode 21b for injecting a current into gain area 1. SiO₂ film 30 serving as an insulating film and a protective film is disposed in an area, where no current needs to be injected, other than p-InGaAs contact layer 26. n electrode 21a is disposed on the reverse side of InP substrate 20 (opposite to the surface on which the waveguides are disposed).

As can be seen from the cross-sectional structures in the direction perpendicular to the light guiding direction, as shown in FIGS. 8c and 8d, the waveguides composed of core layers 24 and active layer 25 have opposite sides etched away down to InP substrate 20. The portions (recesses) that are etched away are of a current constricting structure comprising P-InP current block layer 29 and n-INP current block layer 28: The current constricting structure is also covered entirely with p-InP cladding layer 17 and p-InGaAs contact layer 26. A laser having a DC-PBH (Double Channel Planar Buried Hetero-structure) is known as a waveguide structure similar to the above waveguide structure.

The gain-clamped SOA according to the present embodiment amplifies input light (signal light) (SOA operation) upon laser oscillation at a predetermined wavelength between DBR areas 2, 3 with active layer 25 sandwiched therebetween while a current having a predetermined magnitude is being injected from p electrode 21b into active layer 25.

Input light (signal light) is introduced from device end face 8 and travels successively through window area 6, SSC area 4, and DBR area 2 to gain area 1 wherein the signal light is amplified by being propagated through active layer 25. The amplified signal light travels successively through DBR area 3, SSC area 5, and window area 7 and is emitted from device end face 9.

In gain area 1, the signal light is introduced from single mode waveguide 12 into MMI waveguide 11. Since MMI waveguide 11 is a 1×1 MMI waveguide, a self-projected image of the light introduced from single mode waveguide 12 is obtained at the end face close to single mode waveguide 13. Therefore, MMI waveguide 11 optically couples the light introduced from single mode waveguide 12 to single mode waveguide 13 based on an interferential effect. At this time, there is essentially no demultiplexing and multiplexing loss.

According to the present embodiment, since a portion of active layer 25 is constructed of MMI waveguide 11, the area of active layer 25 is increased, resulting in a corresponding reduction in the density of the input light applied to active layer 25 for an increased saturated output.

Inasmuch as the signal light is amplified by active layer 25 while it is in laser oscillation, active layer 25 is clamped to the oscillation threshold gain for thereby giving a certain gain at all times to the signal light. Therefore, a degradation of the signal waveform due to the gain saturation and interchannel crosstalk upon amplification of wavelength-multiplexed signal light are suppressed.

In the present embodiment, the clamped light is emitted from device end faces 8 and 9. Therefore, this structure requires a filter on device end face 9 for removing the clamped light.

A process of manufacturing the gain-clamped SOA according to the present embodiment will be described below. FIGS. 9a through 9h are views showing a process of successive steps for manufacturing the gain-clamped SOA shown in FIGS. 8a through 8d. FIGS. 9a through 9h illustrate portions corresponding to the three cross-sectional structures shown in FIGS. 8b through 8d.

First, as shown in FIG. 9a, active layer 25 is formed on InP substrate 20 by MOVPE. When active layer 25 is formed, for example, an n-InP buffer layer (having a thickness of 100 nm), a lower SCH layer made of InGaAs (having a wavelength composition of 1.2 µm and a thickness of 100 nm), an active layer (having a thickness of 50 nm) made of InGaAsP having a tensile strain ranging from about −0.2 to −0.3%, an upper SCH layer (having a wavelength composition of 1.2 µm and a thickness of 100 nm) made of InGaAsP, and an n-InP layer (having a thickness of 100 nm) are successively deposited on InP substrate 20.

Then, as shown in FIG. 9b, SiO₂ layer 31 having a shape for protecting gain area 1 is formed by known photolithography and reactive ion etching (RIE). Using SiO₂ layer 31 as a mask, active layer portions deposited in DBR areas 2, 3, SSC areas 4, 5, and window areas 6, 7 are removed by RIE or wet etching.

Then, as shown in FIG. 9c, using SiO₂ layer 31 as a selective growth mask, core layer 24 is grown in DBR areas 2, 3, SSC areas 4, 5, and window areas 6, 7 by MOVPE. When core layer 24 is formed, for example, an n-InP buffer layer (having a thickness of 100 nm), an InGaAsP bulk layer (having a wavelength composition of 1.3 µm and a thickness of 250 nm), a p-InP layer (having a thickness of 120 nm) a grating layer (having a wavelength composition of 1.3 µm and a thickness of 250 nm), and p-InP cover layer (having a thickness of 100 nm) are successively deposited on InP substrate 20. Core layer 24 thus formed is coupled to active layer 25 on the same plane (the substrate surface of InP substrate 20), making up a waveguide layer having a butt-joint structure.

Then, as shown in FIG. 9d, using a resist mask produced by an electron beam (EB) exposure method, the grating layers in DBR areas 2, 3 are etched by a bromine-based etchant to form diffraction grating 23. At the same time, the grating layers in the phase areas of DBR areas 2, 3 are removed.

Then, as shown in FIG. 9e, using SiO₂ layer 32 newly patterned by photolithography and RIE as a mask, semiconductor etching for determining a planar shape of the waveguides of core layers 24 and active layer 25 is performed by RIE, thereby forming two grooves 33a, 33b each having a depth of 2 μm and a width of 5 μm extending along the wave guiding direction and reaching InP substrate 20, in the waveguides of core layers 24 and active layer 25. These grooves 33a, 33b are positioned on the opposite sides of the waveguides.

Then, as shown in FIG. 9f, using SiO₂ layer 32 as a mask, a current constricting structure comprising P-InP current block layer 29 and n-INP current block layer 28 is formed in grooves 33a, 33b by MOVPE. Each of P-InP current block layer 29 and n-INP current block layer 28 has a thickness of 1 μm.

Then, as shown in FIG. 9g, a semiconductor layer including p-InP cladding layer 27 (having a thickness of 5 μm) and p-InGaAs contact layer 26 (having a thickness of 300 nm) is formed in covering relation to the entire substrate surface in which the waveguides and the current constricting structure have been formed, by MOVPE. p-InGaAs contact layer 26 is then divided into areas by etching to electrically separate diffraction gratings 23 in DBR areas 2, 3, the phase areas, and gain area 1.

Then, as shown in FIG. 9h, device separating grooves 33 each having a width of 5 μm are formed on the opposite sides of the waveguides by RIE to form a mesa structure having a width of about 15 μm with the waveguides at the center. The depth of device separating grooves 33 is the depth (abpit 6 μm) that reaches to InP substrate 20. After device separating grooves 33 are formed, an electrode window of SiO₂ is formed by photolithography. Then, p electrode 21b is formed on the substrate surface by ordinary sputtering and lithography, after which the reverse side of InP substrate 20 is polished, and then n electrode 21a is formed on the polished reverse side of InP substrate 20 by sputtering.

The process performed on the wafer is now completed. Then, the wafer is cleaved into devices, and, if necessary, a highly reflecting or non-reflecting coating is applied to the cleaved end faces of the devices. In this manner, the gain-clamped SOA according to the present embodiment is obtained.

EXPERIMENTAL EXAMPLE

The gain saturation performance of the gain-clamped SOA shown in FIGS. 8a through 8d was confirmed by experimentation. First, optical fibers were coupled to device end faces 8, 9 of the gain-clamped SOA, and light having a wavelength of 1.55 μm with a superimposed NRZ modulated signal having a bit rate of 10 Gb/s was applied. When the light intensity of the input signal light was varied at a constant injected current of 700 mA, a constant fiber-to-fiber gain of 20 dB was achieved when the input light intensity was 2 dBm or less. At the same time, it was confirmed that clamped light was being oscillated at a wavelength of 1.51 μm. When a signal error rate of the output signal waveform was measured, no significant increase in the signal error rate as compared with the signal error rate of a signal not passing through the SOA was observed. When the input light intensity was 2 dBm or greater, clamped light stops oscillating, and a reduction in the fiber-to-fiber gain was confirmed.

It was seen from the above results that the SOA according to the present invention achieves high gain characteristics that have heretofore been not realized, i.e., a fiber-to-fiber gain of 20 dB or more and a saturated output of 20 dBm or more. The polarization dependent gain (PDG) measured while the polarization of the input light was being rotated was 0.5 dB or less.

Then, wavelength-multiplexed signal light produced by superimposing an NRZ modulated signal having a bit rate of 10 Gb/s on laser beams having respective wavelengths of 1.54 μm and 1.55 μm and multiplexing the laser beams was applied to device end face 8, and signal transmission characteristics of the gain-clamped SOA in the vicinity of a saturated output point were measured. The WDM signal light having the two wavelengths was employed for the reason that the effect of turning on and off of the multiplexed wavelengths was the greatest. The amplified signal light was demultiplexed into transmitted signals having the respective wavelengths of 1.54 μm and 1.55 μm, and signal error rates of the transmitted signals were measured. A significant degradation of the power penalty was obtained for both of the wavelengths. As a result, it was seen that the gain-clamped SOA has good wavelength crosstalk performance.

2nd Embodiment

Figures 10A, 10B:
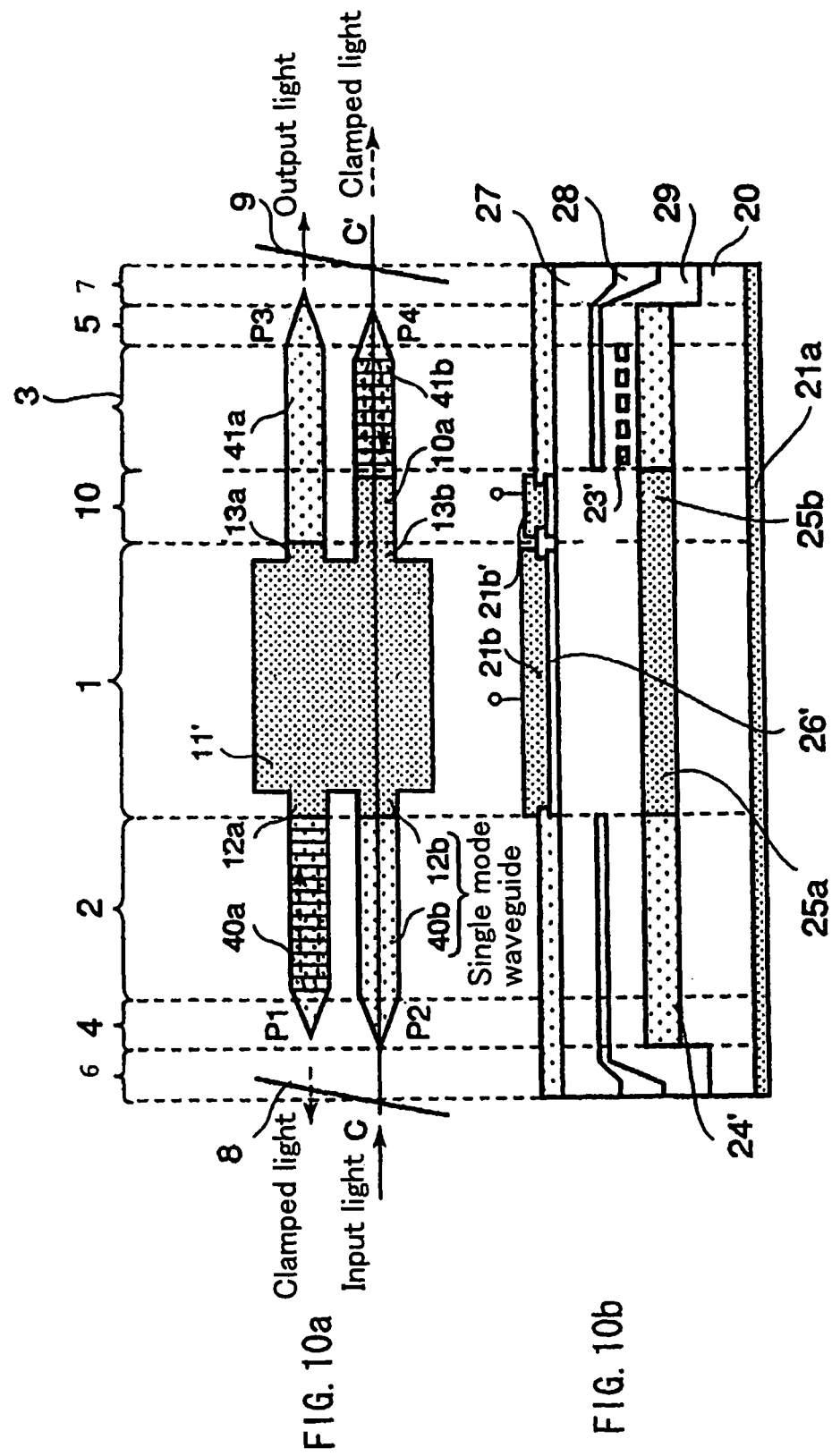

FIG. 10a is a plan view of a structure of a gain-clamped SOA according to a second embodiment of the present invention, and FIG. 10b is a cross-sectional view taken along line C-C' of the structure shown in FIG. 10a.

First, a structure of waveguides of the gain-clamped SOA according to the present embodiment will be described below with reference to FIG. 10a. The gain-clamped SOA according to the present embodiment is basically structurally similar to the gain-clamped SOA shown in FIG. 8a except that a first path through which input light is propagated (a path interconnecting port P2 near device end face 8 and port 3 near device end face 9) and a second path through which clamped light is propagated (a path interconnecting port P1 near device end face 8 and port 4 near device end face 9) are spatially separate from each other. Those structural parts shown in FIG. 10a which are identical to those shown in FIG. 8a are denoted by identical reference characters.

On the first path, the waveguides closer to device end face 8 and the waveguides closer to device end face 9 are symmetrical with respect to gain area 1 at the center. On the second path with gain area 1 at the center, the waveguides closer to device end face 9 are different from the waveguides closer to device end face 8 in that gain adjusting area 10 is provided.

The waveguides in gain area 1 include MMI waveguide 11' having a 1×1 MMI structure and single mode waveguides 12a, 12b, 13a, 13b disposed at opposite ends thereof. Single mode waveguide 12a is joined to port P1 through single mode waveguide 40a, and single mode waveguide 12b is joined to port P2 through single mode waveguide 40b. Single mode waveguide 13a is joined to port P3 through single mode waveguide 41a, and single mode waveguide 13b is joined to port P4 through single mode waveguides 10a, 41b. MMI waveguide 11' is arranged such that light applied thereto from single mode waveguide 12b is propagated through a multimode area and thereafter optically coupled to single mode waveguide 13a with a very low loss based on an interferential effect.

Single mode waveguides 40a, 40b extend over a plurality of areas, including DBR area 2 and SSC area 4. In each of single mode waveguides 40a, 40b, the waveguide of SSC area 4 is of a tapered shape whose width is progressively smaller toward device end face 8. The length of the tapered portion of single mode waveguide 40a is smaller than the length of the tapered portion of single mode waveguide 40b. Single mode waveguide 41a extends over a plurality of areas, including gain adjusting area 10, DBR area 3, and SSC area 5, and single mode waveguide 41b extends over a plurality of areas, including DBR area 3 and SSC area 5. In each of single mode waveguides 41a, 41b, the waveguide of SSC area 4 is of a tapered shape whose width is progressively smaller toward device end face 9. The length of the tapered portion of single mode waveguide 41b is smaller than the length of the tapered portion of single mode waveguide 41a. Single mode waveguide 10a corresponds to gain adjusting area 10.

A cross-sectional structure of the gain-clamped SOA according to the present embodiment will be described below with reference to FIG. 10b.

Active layer 25a and gain adjusting active layer 25b are disposed adjacent to each other on the substrate surface of InP substrate 20, and core layers 24' are disposed on both sides of active layer 25a and gain adjusting active layer 25b. The waveguides that make up the first and second paths are of a butt-joint structure in which core layers 24', active layer 25a, and gain adjusting active layer 25b are butt-joined in the same substrate plane.

MMI waveguide 11' and single mode waveguides 12a, 12b, 13a, 13b are constructed of active layer 25a, single mode waveguide 10b of gain adjusting active layer 25b, and single mode waveguides 40a, 40b, 41a, 41b of core layers 24'. Diffraction gratings 23' are disposed on the portion of single mode waveguide 40a which corresponds to DBR area 2 and the portion of single mode waveguide 41b which corresponds to DBR area 3, allowing laser oscillation to occur at a predetermined wavelength in the second path (the path between ports P1, P4).

Active layer 25a, core layers 24', and diffraction gratings 23' are structurally similar to active layer 25, core layers 24, and diffraction gratings 23 in the structure shown FIG. 8b. Gain adjusting active layer 25b is structurally identical to active layer 25a. Gain adjusting active layer 25b may be constructed of a portion of active layer 25a.

The waveguides made up of core layers 24', active layer 25a, and gain adjusting active layer 25b are covered entirely with a semiconductor layer including p-InP cladding layer 27 and p-InGaAs contact layer 26'. p-InGaAs contact layer 26' is disposed in an area corresponding to active layer 25a and gain adjusting active layer 25b, and has p-electrodes 21b, 21b' on its upper surface. p-electrode 21b serves to inject a current into active layer 25a in gain area 1, and p-electrode 21b' serves to inject a current into gain adjusting active layer 25b in gain adjusting area 10.

Portions (current constricting structure, etc.) other than the structure described above are basically similar to those shown in FIGS. 8a through 8d, and will not be described in detail below.

The gain-clamped SOA according to the present embodiment amplifies input light (signal light) (SOA operation) upon laser oscillation at a predetermined wavelength between DBR areas 2, 3 in the second path (the path between ports P1, P4) while a current having a predetermined magnitude is being injected from p electrode 21b into active layer 25a.

Input light (signal light) is propagated through the first path (the path between ports P2, P3) that is spatially separate from the second path (the path between ports P1, P4). Input light (signal light) introduced from port P2 is propagated through single mode waveguide 40b and reaches gain area 1 wherein the signal light is amplified by being propagated through active layer 25a. The amplified signal light is propagated through single mode waveguide 41a and emitted from port P3.

In gain area 1, the signal light is introduced from single mode waveguide 12b into MMI waveguide 11'. Since MMI waveguide 11' is a 1×1 MMI waveguide, a self-projected image of the light introduced from single mode waveguide 12b is obtained at the end face close to single mode waveguide 13a. Therefore, MMI waveguide 11' optically couples the light introduced from single mode waveguide 12b to single mode waveguide 13a based on an interferential effect. At this time, there is essentially no demultiplexing and multiplexing loss. The clamped light is propagated through the second path (the path between ports P1, P4) and emitted from ports P1, P4.

According to the present embodiment, since a portion of active layer 25a is constructed of MMI waveguide 11', the area of active layer 25a is increased, resulting in a corresponding reduction in the density of the input light applied to active layer 25a for an increased saturated output.

Inasmuch as the signal light is amplified by active layer 25a while it is in laser oscillation, active layer 25a is clamped to the oscillation threshold gain for thereby giving a certain gain at all times to the signal light.

By controlling the amount of a current injected into or a voltage applied to gain adjusting active layer 25b, it is possible to tune the laser oscillation threshold gain of clamped light in the second path (the path between ports P1, P4). The tuning also serves to vary the gain coefficient of active layer 25a in gain area 1. Therefore, it is possible to adjust the gain of the signal light by controlling the current injected into gain adjusting active layer 25b.

According to the present embodiment, since the clamped light is propagated through the second path (the path between ports P1, P4) that is spatially separate from the first path (the path between ports P2, P3) through which the signal light is propagated, a filter for removing the clamped light which is needed in the first embodiment is not required, and the clamped light and the signal light may have the same wavelength.

A process of fabricating the gain-clamped SOA according to the present embodiment is substantially the same as the fabricating process described above in the first embodiment, and will briefly be described below. As with the gain-clamped SOA according to the first embodiment, the gain-clamped SOA according to the second embodiment is of a DC-PBH structure. Briefly stated, the fabricating process includes the steps of growing active layers of gain area 1 and gain adjusting area 10, removing active layers in DBR areas 2, 3, SSC areas 4, 5, and window areas 6, 7, regrowing core layers 24' in those areas to form a butt-joint structure, forming diffraction gratings 23', forming a waveguide pattern, growing a current constricting structure, growing embedded layers, separating devices, forming electrodes, cleaving the wafer, and coating end faces.

3rd Embodiment

Figure 11:
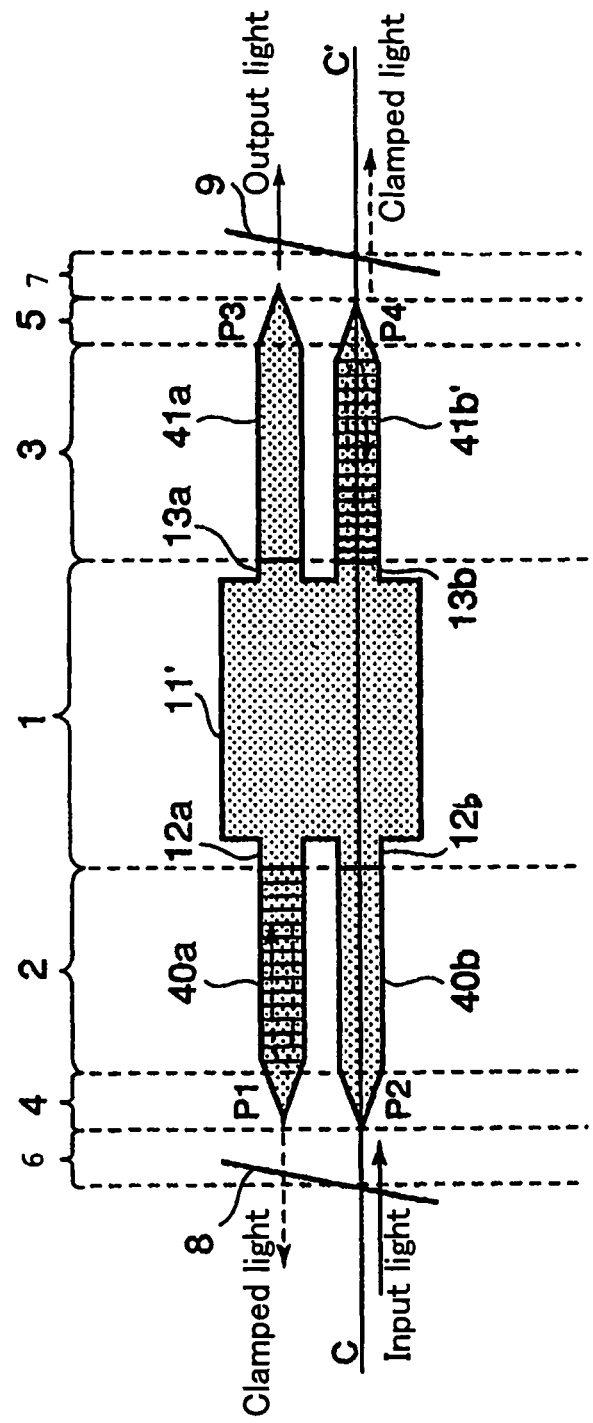
FIG. 11 is a plan view of a structure of a gain-clamped semiconductor optical amplifier according to a third embodiment of the present invention.

FIG. 11 is a plan view of a structure of a gain-clamped SOA according to a third embodiment of the present invention. The gain-clamped SOA according to the present embodiment is basically structurally similar to the gain-clamped SOA according to the second embodiment except that the waveguides in the first and second paths that are spatially separate from each other are all constructed of active layers, and the DBR area from which output light is emitted doubles as a gain adjusting area. Those structural parts shown in FIG. 11 which are identical to those according to the second embodiment are denoted by identical reference characters.

On the first path (the path between ports P2, P2) through which input light (signal light) is propagated, the waveguides closer to device end face 8 and the waveguides closer to device end face 9 are symmetrical with respect to gain area 1 at the center. On the second path (the path between ports P1, P4) through which clamped light is propagated, the waveguides closer to device end face 8 and the waveguides closer to device end face 9 are substantially symmetrical with respect to gain area 1 at the center, but the waveguides closer to device end face 9 are different from the waveguides closer to device end face 8 in that DBR area 3 closer to device end face 9 doubles as a gain adjusting area. Specifically, single mode waveguide 41b' in DBR area 3 in the second path is arranged so as to be able to individually control the injection of a current into the active layer though it is of a DBR structure. Single mode waveguide 13b in gain area 1 is joined to port P4 through single mode waveguide 41b'.

With the gain-clamped SOA according to the present embodiment, the input light (signal light) introduced from port P2 is amplified by being propagated through the active layer in gain area 1, as with the gain-clamped SOA according to the second embodiment. The amplified signal light is emitted from port P3. The clamped light is propagated through the second path (the path between ports P1, P4) and emitted from ports P1, P4. The laser oscillation threshold gain is adjusted by controlling the amount of a current injected into or a voltage applied to the active layer in DBR area 3, unlike the second embodiment.

With the gain-clamped SOA according to the present embodiment, the waveguides are all constructed of active layers. Therefore, the fabricating process is shorter than with the first and second embodiments as the formation of a butt-joint structure is dispensed with. Other features are the same as those described in the second embodiment.

A process of fabricating the gain-clamped SOA according to the present embodiment is substantially the same as the fabricating process described above in the first embodiment except that it has no butt-joint structure forming step, and will briefly be described below. As with the gain-clamped SOA according to the first embodiment, the gain-clamped SOA according to the present embodiment is of a DC-PBH structure. Briefly stated, the fabricating process includes the steps of growing active layers of all waveguides including gain area 1, forming diffraction gratings in DBR areas 2, 3, forming a waveguide pattern, growing a current constricting structure, growing embedded layers, separating devices, forming electrodes, cleaving the wafer, and coating end faces.

4th Embodiment

Figure 12:
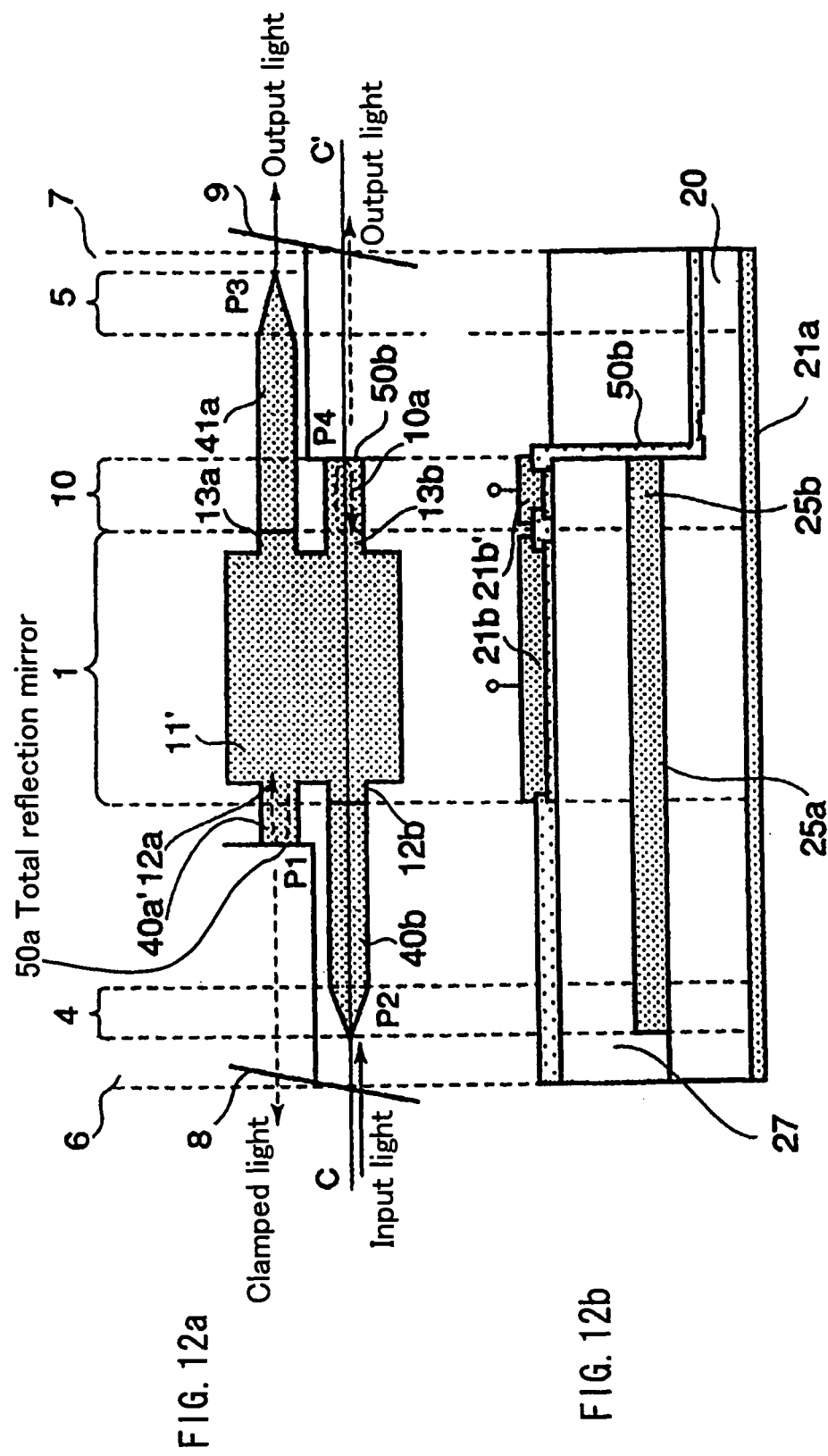

FIG. 12a is a plan view of a structure of a gain-clamped SOA according to a fourth embodiment of the present invention, and FIG. 12b is a cross-sectional view taken along line C-C' of the structure shown in FIG. 12a. The gain-clamped SOA according to the present embodiment is basically structurally similar to the gain-clamped SOA according to the second embodiment except that the waveguides in the first and second paths that are spatially separate from each other are all constructed of active layers, and the DBR areas are replaced with totally reflecting mirrors. Those structural parts shown in FIGS. 12a, 12b which are identical to those according to the second embodiment are denoted by identical reference characters.

The first path (the path between ports P2, P2) through which input light (signal light) is propagated comprises single mode waveguides 40b, 12b, MMI waveguide 11', and single mode waveguides 13a, 10a. On the first path, the waveguides closer to device end face 8 and the waveguides closer to device end face 9 are symmetrical with respect to MMI waveguide 11' in gain area 1 at the center.

The second path (the path between ports P1, P4) through which clamped light is propagated comprises single mode waveguides 40b, 12b, MMI waveguide 11', and single mode waveguides 13a, 41a. On the second path, the waveguides closer to device end face 8 and the waveguides closer to device end face 9 are substantially symmetrical with respect to MMI waveguide 11' in gain area 1 at the center. However, gain adjusting area 10 is provided in a portion of the waveguides closer to device end face 9, i.e., single mode waveguide 10a. One end of single mode waveguide 40a' serves as port P1 where totally reflecting mirror 50a is disposed. The other end of single mode waveguide 40a' is joined to single mode waveguide 12a. One end of single mode waveguide 10a serves as port P4 where totally reflecting mirror 50n is disposed.

With the gain-clamped SOA according to the present embodiment, the input light (signal light) introduced from port P2 is amplified by being propagated through active layer 25a in gain area 1, as with the gain-clamped SOA according to the second embodiment. The amplified signal light is emitted from port P3. The clamped light is propagated through the second path (the path between ports P1, P4) and emitted from ports P1, P4. The laser oscillation is performed between totally reflecting mirrors 50a, 50n, unlike the second embodiment. The signal light amplifying operation and the clamping operation at the oscillation threshold gain are identical to those according to the second and third embodiments, and will not be described in detail below.

With the gain-clamped SOA according to the present embodiment, the waveguides are all constructed of active layers. Therefore, the formation of a butt-joint structure is dispensed with as with the third embodiment, and hence the fabricating process is shorter than with the first and second embodiments. In addition, since the reflectors comprise totally reflecting mirrors, no gratings need to be formed. Consequently, the fabricating process is shorter than with the third embodiment. Other features are the same as those described in the second embodiment.

In the arrangement shown in FIGS. 12a, 12b, the totally reflecting mirrors are employed as reflectors replacing the DBRs. Reflecting films comprising dielectric multiple films or fiber Bragg reflectors may also be employed as reflectors.

A process of fabricating the gain-clamped SOA, according to the present embodiment is substantially the same as the fabricating process described above in the third embodiment except that it has no step of forming gratings and totally reflecting mirrors 50a, 50b having dry-etched end faces are provided at ports P1, P4 in the device separating step, and will briefly be described below. As with the gain-clamped SOA according to the first embodiment, the gain-clamped SOA according to the present embodiment is of a DC-PBH structure. Briefly stated, the fabricating process includes the steps of growing active layers of all waveguides including gain area 1, forming a waveguide pattern, growing a current constricting structure, growing embedded layers, separating devices, forming electrodes, cleaving the wafer, and coating end faces.

5th Embodiment

Figure 13:
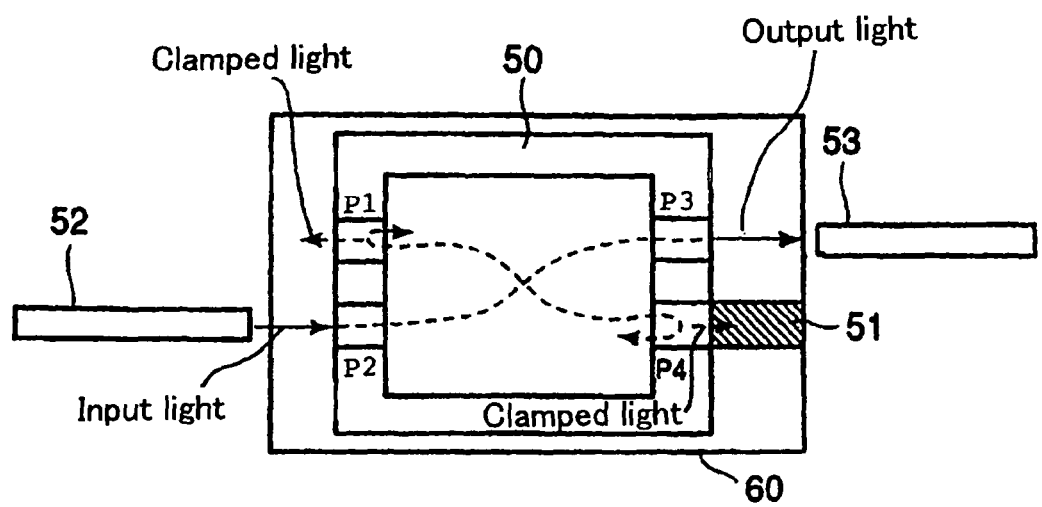
FIG. 13 is a plan view of an arrangement of a gain-clamped semiconductor optical amplifier with an optical monitor according to a fifth embodiment of the present invention.

FIG. 13 is a plan view of an arrangement of a gain-clamped semiconductor optical amplifier with an optical monitor according to a fifth embodiment of the present invention. Gain-clamped SOA 60 with an optical monitor according to the present embodiment comprises gain-clamped SOA 50 having a structure according to either one of the second through fourth embodiments described above and monitoring photodiode (PD) 51 for detecting clamped light emitted from port P4 of gain-clamped SOA 50.

PD 51 outputs an electric signal depending on the light intensity of the clamped light emitted from port P4 of gain-clamped SOA 50. The output signal from PD 51 is supplied to a drive circuit (not shown) for controlling current injection in gain area 1 and current injection for gain adjustment, and a variable attenuator (or a variable amplifier) outside of the SOA. PD 51 may be mounted in any of various ways depending on the design. For example, PD 51 may be monolithically integrated on the substrate of gain-clamped SOA 50, or may be disposed in the vicinity of an end face of port P4 of gain-clamped SOA 50 within a module including gain-clamped SOA 50.

According to the present embodiment, based on the fact that the emission light intensity of the clamped light is correlated (negatively correlated) to the input light intensity of the signal light, the light intensity of the clamped light is monitored to realize stable light output operation (Automatic power control: APC) of the gain-clamped SOA. APC operation of gain-clamped SOA 60 with an optical monitor will specifically be described below.

Gain-clamped SOA 60 with an optical monitor is inserted between optical fiber transmission paths 52, 53, and amplifies signal light that is propagated from optical fiber transmission path 52 to optical fiber transmission path 53. The signal light is generally represented by a wavelength-multiplexed or time-multiplexed signal. Operation will be described below with respect to an example which employs a wavelength-multiplexed signal.

Figure 14:
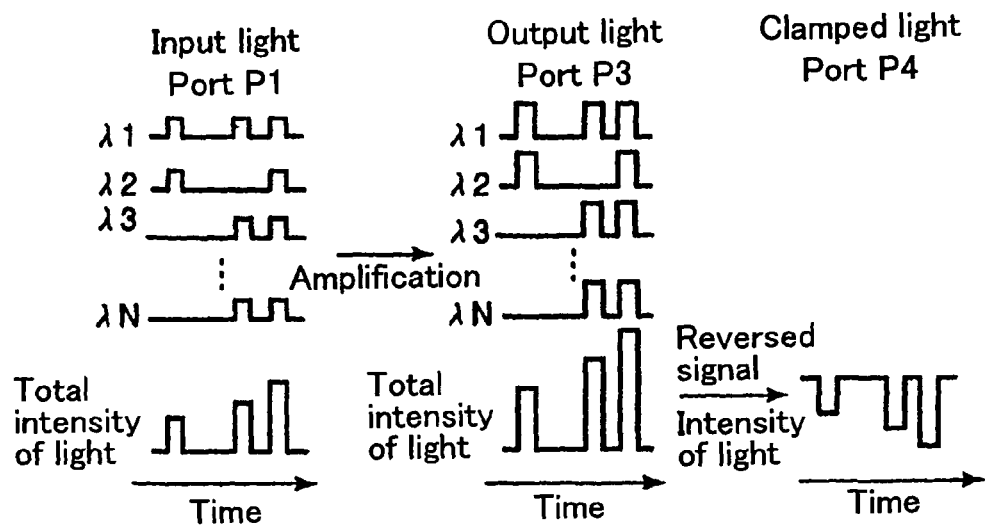
FIG. 14 is a diagram illustrative of operation of the gain-clamped semiconductor optical amplifier with the optical monitor shown in FIG. 13.

As shown in FIG. 14, when wavelength-multiplexed signal light (wavelengths λ1 through λN) is introduced from port P1 of gain-clamped SOA 50, the total light intensity of the input light is represented by the sum of the light intensities of lights having wavelengths λ1 through λN. The lights having wavelengths λ1 through λN are amplified by gain-clamped SOA 50, and the amplified lights are transmitted as output light from port P3 to optical fiber transmission path 53.

In the above optical amplification process, the clamped light emitted from port P4 of gain-clamped SOA 50 exhibits light intensity changes which are an inversion of the input light intensity due to cross gain modulation (XGM) with the input light. Therefore, the total light intensity of the input light applied to gain-clamped SOA 50 can indirectly be known by detecting such light intensity changes with PD 51. Information thus obtained as to the input light intensity is fed back for adjusting the gain of gain-clamped SOA 50 or energizing an external variable optical attenuator or variable amplifier thereby to perform APC operation.

Figure 15A:
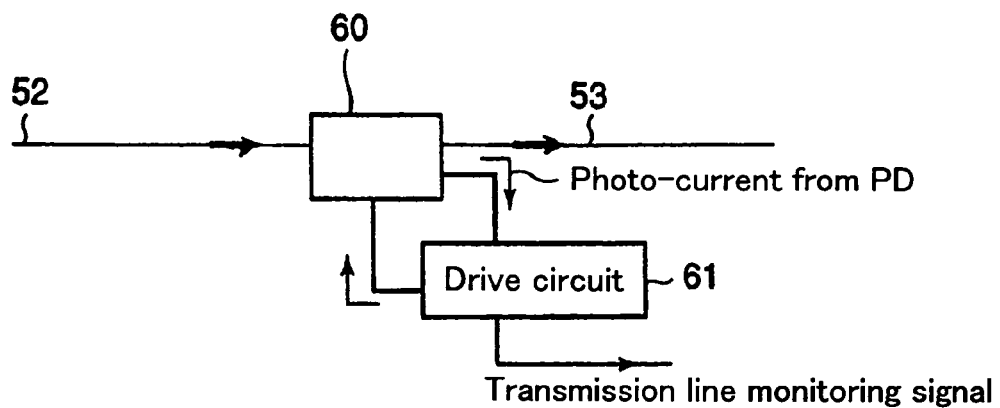
FIG. 15a is a block diagram of a repeater amplifier which performs APC operation by effecting feedback control on the driving for gain adjustment.

FIG. 15a is a block diagram of a repeater amplifier which performs APC operation by effecting feedback control on the driving for gain adjustment. The repeater amplifier comprises gain-clamped SOA 60 with an optical monitor which has gain-clamped SOA 50 having PD 51, and drive circuit 61 for controlling current injection for adjusting the gain of gain-clamped SOA 50. Current injection control performed by drive circuit 61 is represented by current injection control in gain adjusting area 10 according to the second and fourth embodiments, or current injection control in DBR area 3 according to the third embodiment. The output signal from PD 51 is applied to drive circuit 61. When drive circuit 61 performs current injection control to keep the output signal of PD 51 constant, the light intensity of output light from gain-clamped SOA 51 is made constant for APD operation.

Figure 15B:
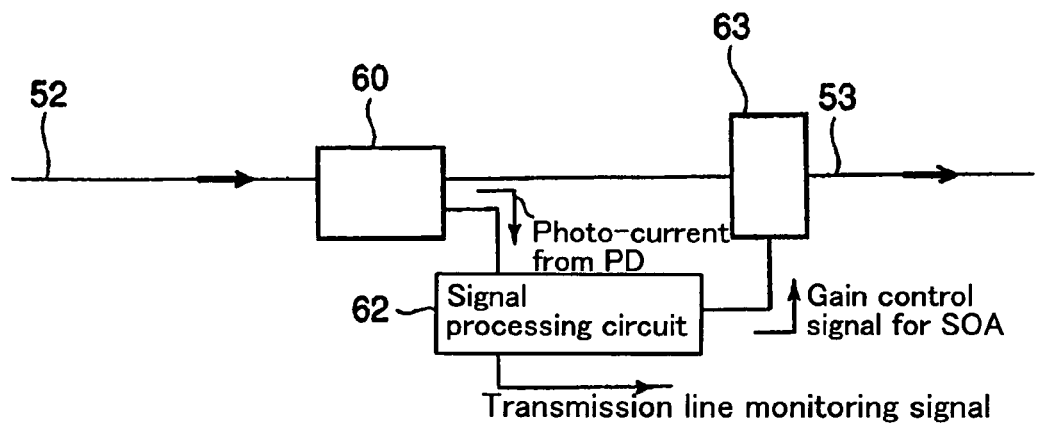
FIG. 15b is a block diagram of a repeater amplifier which performs APC operation by effecting feedback control on the driving of a variable attenuator (or a variable amplifier)

FIG. 15b is a block diagram of a repeater amplifier which performs APC operation by effecting feedback control on the driving of a variable optical attenuator (or a variable amplifier). The repeater amplifier comprises gain-clamped SOA 60 with an optical monitor which has gain-clamped SOA 50 having PD 51, variable optical attenuator/amplifier 63 inserted in optical fiber transmission path 53 to which output light from gain-clamped SOA 50 is applied, and signal processing circuit 62 for adjusting the gain of variable optical attenuator/amplifier 63. The output signal from PD 51 is applied to signal processing circuit 62. When signal processing circuit 62 adjust the gain of variable optical attenuator/amplifier 63 depending on a change in the output from PD 51, the light intensity of output light from variable optical attenuator/amplifier 63 is made constant for APD operation.

In each of the above repeater amplifiers, the output from PD 51, i.e., the information as to the total input light intensity, is also effective to monitor and control operation of the entire transmission system including the repeater amplifier. Therefore, drive circuit 61 and signal processing circuit 62 are arranged to output the information as to the total input light intensity as a transmission line monitoring signal.

With the repeater amplifier shown in FIG. 15b, optical components such as an optical filter and an optical coupler may be inserted between the variable optical attenuator and the variable optical amplifier of variable optical attenuator/amplifier 63. Therefore, the function of the repeater amplifier as a repeater can be arranged more flexibly.

A process of separating a portion of transmitted signal light with an optical coupler is generally known as a process of monitoring the intensity of light which is propagated through a transmission path. If this process is applied to the above monitoring arrangement, then the signal light is attenuated by the separated light. The present embodiment is advantageous in this respect because the intensity of light can be monitored without attenuating the signal light.

6th Embodiment

A receiver (photodiode) in an optical communication system is required to convert weak signal light that has been greatly attenuated by a propagation loss into an electric signal without an error. For reducing a signal conversion error, it is effective to provide an optical preamplifier for optically amplifying propagated light with attenuated intensity immediately prior to a PD serving as a photodetector to improve the S/N ratio (signal/noise ratio) of the signal light. A receiver which employs either one of the gain-clamped SOAs according to the second through fourth embodiments as such an optical preamplifier will be described below.

Figure 16:
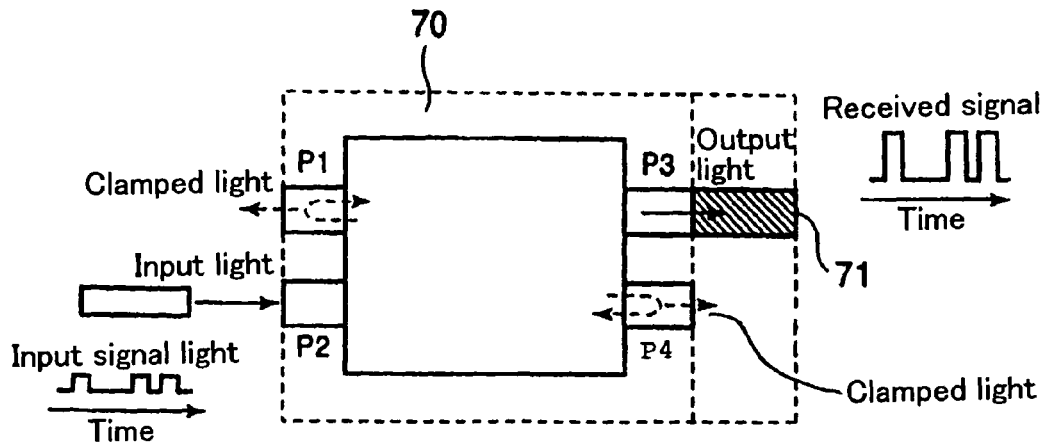
FIG. 16 is a plan view of a photodiode (PD) with an SOA optical amplifier according to a sixth embodiment of the present invention.

FIG. 16 is a plan view of a photodiode (PD) with an SOA optical amplifier according to a sixth embodiment of the present invention. The PD with an SOA optical amplifier comprises gain-clamped SOA 70 having a structure according to either one of the second through fourth embodiments described above and PD 71 for detecting clamped light emitted from port P3 of gain-clamped SOA 70. PD 71 may be mounted in any of various ways depending on the design. For example, PD 71 may be monolithically integrated on the substrate of gain-clamped SOA 70, or may be disposed in the vicinity of an end face of port P3 of gain-clamped SOA 50 within a module including gain-clamped SOA 70.

With the PD with an SOA optical amplifier according to the present embodiment, weak signal light that has been greatly attenuated by a propagation loss is introduced from port P2 of gain-clamped SOA 70 and amplified by gain-clamped SOA 70. The amplified signal light is output from port P3 of gain-clamped SOA 70 and applied to PD 71. According to this arrangement, the S/N ratio of the signal light can be improved by amplifying the weak signal light with gain-clamped SOA 70 immediately prior to PD 71. By using gain-clamped SOA 70 which incorporates the structure according to the second through fourth embodiments as the optical preamplifier, a degradation of the signal waveform on account of a gain saturation can be suppressed for more stable reception of the signal light.

In the applications of optical amplifiers, signal light applied to a gain-clamped SOA is generally of a single wavelength that has been wavelength-demodulated.

7th Embodiment

Figure 17A:
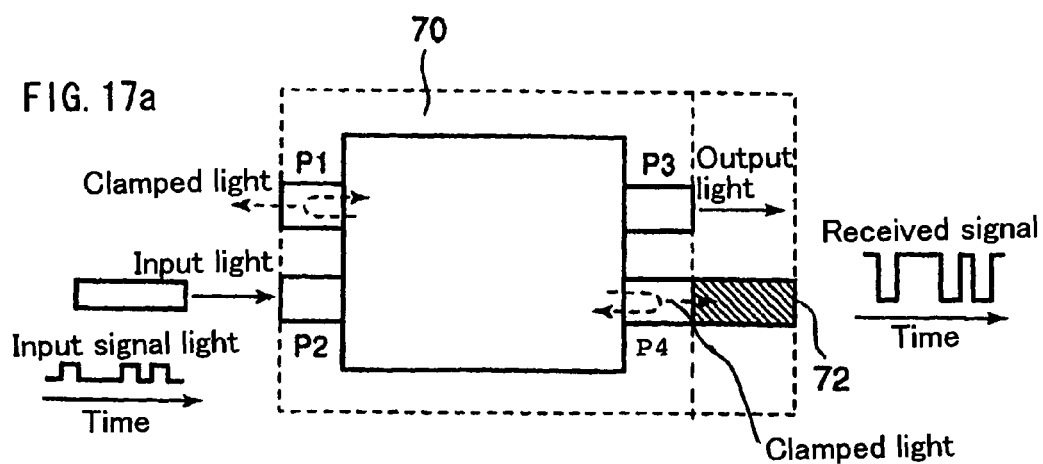
FIG. 17a is a plan view of a PD with an SOA optical amplifier according to a seventh embodiment of the present invention.

FIG. 17a is a plan view of a PD with an SOA optical amplifier according to a seventh embodiment of the present invention. The PD with an SOA optical amplifier is the same as the PD with an SOA optical amplifier according to the sixth embodiment except that PD 71' for detecting clamped light emitted from port P4 is provided instead of PD 71 for detecting output light emitted from port P3. Those parts in FIG. 17a which are identical to those of the sixth embodiment are denoted by identical reference characters.

The PD with an SOA optical amplifier according to the present embodiment is of exactly the same device arrangement as the PD with an SOA optical amplifier according to the fifth embodiment described above. The present embodiment is also based on the fact that the clamped light emitted from port P4 of gain-clamped SOA 70 exhibits light intensity changes which are an inversion of the input light intensity due to cross gain modulation (XGM) with the input light applied from port P2. Specifically, the clamped light emitted from P4, rather than the output light (amplified signal light) emitted form port P3, is detected by the PD 71', so that the PD operates as a receiver. The operating principles of the PD will be described below.

Figure 17B:
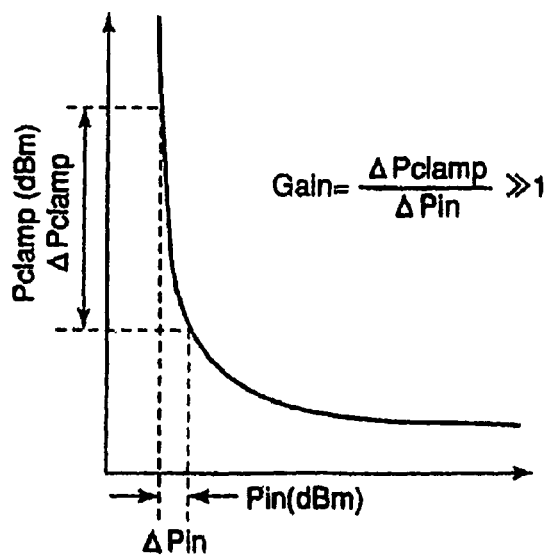
FIG. 17b is a graph showing the relationship between the input light intensity of signal light and the output light intensity of clamped light.

FIG. 17b is a graph showing the relationship between the input light intensity of the signal light (the input light applied to port P2) and the output light intensity of the clamped light. The horizontal axis represents the input light intensity $P_{in}$, (dBm) of the signal light, and the vertical axis the output light intensity $P_{clamp}$ (dBm) of the clamped light which varies due to cross gain modulation (XGM) with the signal light. As can be seen from the graph, when the input light intensity $P_{in}$ is small, the output light intensity $P_{clamp}$ varies greatly ($\Delta P_{clamp}$) depending on a small change ($\Delta P_{in}$) in the input light intensity $P_{in}$. This means that the signal is amplified at a gain of ($\Delta P_{clamp}/\Delta P_{in}$) through the XGM between the signal light and the clamped light. According to the present embodiment, when the clamped light thus amplified is detected by PD 71', the signal light is converted into an electric signal.

The PD with an SOA optical amplifier according to the present embodiment is capable of reducing spontaneously emitted light (which becomes noise when applied to PD 71) generated when the SOA is energized. Therefore, an optical amplifier with lower noise can be realized, and an error rate of signal conversion can be lowered.

The structures according to the sixth and seventh embodiments may be combined with each other, i.e., PDs 71, 71' may be provided respectively at ports P3, P4 of the gain-clamped SOA. In this case, detected signals from PDs 71, 71' can be compared with each other to increase the accuracy with which to detect a signal, making it possible to further reduce an error rate of signal conversion.

Since the device structures according to the present invention described above allow additional functions such as of gain changing and optical monitoring to be integrated, they are advantageous as to a reduction in the module or system cost.

In the above description, SOAs in the 1.55 μm band for use in optical communication applications have been described. However, the present invention and the wavelength bands are not limited to the details described above. The present invention is also applicable to SOAs for use with visible light and infrared radiation. Various semiconductor materials such as InAlAs, GaInNAs, quantum-dot active layers, etc. can also be employed.

The present invention is not limited to the arrangements of the above embodiments, and its arrangements may be changed without departing from the scope of the invention. For example, a photodiode may be provided at the output port according to the first embodiment, and may be used as a receiver in an optical communication system. A totally reflecting mirror may be used instead of a DBR, or a DBR may be used instead of a totally reflecting mirror. A photodiode for detecting clamped light may be provided at port 2, rather than port 4.

The SOA according to the present invention is not limited to applications of optical amplifiers. Expected applications of SOAs include optical amplifiers, high-speed switching gates, wavelength converters, waveform shapers, fully optical logic circuits, etc. The structures according to the present invention are also applicable to SOAs in these applications.

According to the present invention, as described above, it is possible to realize a semiconductor optical amplifier which is capable of replacing an EDFA, has very high saturated gain characteristics, is small in size, and low in cost.

The invention claimed is:

1. A gain-clamped semiconductor optical amplifier comprising:
    a gain area for amplifying guided light, said gain area including a multimode interference optical waveguide;
    a pair of reflectors disposed such that said gain area is disposed between said pair of reflectors;
    a first port for receiving external signal light;
    a second port for emitting light which has been amplified by said gain area; and
    third and fourth ports for emitting clamped light generated by said reflectors;
    wherein:
        said multimode interference optical waveguide has a waveguide end face connected to said first port through a first single mode waveguide and connected to said third port through a second single mode waveguide, and another waveguide end face connected to said second port through a third single mode waveguide and connected to said fourth port through a fourth single mode waveguide;
        one of said reflectors is disposed in said second single mode waveguide, and the other of said reflectors is disposed in said fourth single mode waveguide;
        said first and fourth single mode waveguides are disposed respectively on opposite end sections of said multimode interference optical waveguide;
        said second and third single mode waveguides are disposed respectively on opposite end sections of said multimode interference optical waveguide;
        said first and third single mode waveguides propagate said signal light, and said second and fourth single mode waveguides propagate said clamped light;
        a part of one of said second and said fourth single mode waveguides comprises a gain adjusting area for adjusting an oscillation threshold gain of said clamped light; and
        when a current is injected into or a voltage is applied to said gain adjusting area, said gain adjusting area produces a gain of said clamped light or attenuates said clamped light, thereby adjusting said oscillation threshold gain of said clamped light.

2. A gain-clamped semiconductor optical amplifier according to claim 1, further comprising:
a first port for receiving external signal light; and
a second port for emitting light which has been amplified by said gain area;
wherein said multimode interference optical waveguide has a waveguide end face connected to said first port through a first single mode waveguide and another waveguide end face connected to said second port through a second single mode waveguide; and
one of said reflectors is disposed in said first single mode waveguide, and the other of said reflectors is disposed in said second single mode waveguide.

3. The gain-clamped semiconductor optical amplifier according to claim 1, wherein a waveguide except the waveguide of said gain area and said gain adjusting area comprises a passive waveguide.

4. The gain-clamped semiconductor optical amplifier according to claim 1, wherein said first through fourth single mode waveguides, said multimode interference optical waveguide, and said gain adjusting area comprise an active layer waveguide for producing a gain of said signal light or said clamped light, or for attenuating said signal light or said clamped light by injected current or applied voltage.

5. The gain-clamped semiconductor optical amplifier according to claim 1, wherein at least one of said reflectors has a wavelength selecting capability.

6. The gain-clamped semiconductor optical amplifier according to claim 5, wherein the reflector having a wavelength selecting capability comprises a distributed Bragg reflector.

7. A gain-clamped semiconductor optical amplifier according to claim 1, wherein said reflectors comprise totally reflecting minors.

8. A gain-clamped semiconductor optical amplifier according to claim 1, further comprising:
a photodetector for detecting the clamped light emitted from said third or fourth port.

9. A gain-clamped semiconductor optical amplifier according to claim 2, further comprising:
a photodetector for detecting the light emitted from said second port.

10. A gain-clamped semiconductor optical amplifier according to claim 1, further comprising:
a photodetector for detecting the light emitted from said second port.

11. A gain-clamped semiconductor optical amplifier according to claim 2, wherein at least one of said reflectors has a wavelength selecting capability.

12. The gain-clamped semiconductor optical amplifier according to claim 3, wherein at least one of said reflectors has a wavelength selecting capability.

13. A gain-clamped semiconductor optical amplifier according to claim 2, wherein said reflectors comprise totally reflecting minors.

14. A gain-clamped semiconductor optical amplifier according to claim 1, wherein said reflectors comprise totally reflecting minors.

* * * * *

UNITED STATES PATENT AND TRADEMARK OFFICE
CERTIFICATE OF CORRECTION

PATENT NO.         : 8,503,072 B2                        Page 1 of 1
APPLICATION NO.    : 10/548880
DATED              : August 6, 2013
INVENTOR(S)        : Hiroshi Hatakeyama It is certified that error appears in the above-identified patent and that said Letters Patent is hereby corrected as shown below:

In the Specification

Column 17, Line 50: Delete "28:" and insert -- 28. --

Column 24, Line 44: Delete "SOA," and insert -- SOA --

In the Claims

Column 30, Line 7: In Claim 7, delete "minors." and insert -- mirrors. --

Column 30, Line 27: In Claim 13, delete "minors." and insert -- mirrors. --

Column 30, Line 30: In Claim 14, delete "minors." and insert -- mirrors. --

Signed and Sealed this
Eleventh Day of November, 2014

Michelle K. Lee
*Deputy Director of the United States Patent and Trademark Office*